United States Patent
Gokmen et al.

(10) Patent No.: US 12,314,844 B2
(45) Date of Patent: May 27, 2025

(54) EXTRACTION OF WEIGHT VALUES IN RESISTIVE PROCESSING UNIT ARRAY

(71) Applicant: International Business Machines Corporation, Armonk, NY (US)

(72) Inventors: Tayfun Gokmen, Briarcliff Manor, NY (US); Wilfried Haensch, Somers, NY (US); Stefano Ambrogio, San Jose, CA (US); Charles Mackin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1025 days.

(21) Appl. No.: 17/340,242

(22) Filed: Jun. 7, 2021

(65) Prior Publication Data

US 2022/0391681 A1      Dec. 8, 2022

(51) Int. Cl.
*G06N 3/065* (2023.01)
*G06N 3/04* (2023.01)
(Continued)

(52) U.S. Cl.
CPC .............. *G06N 3/065* (2023.01); *G06N 3/04* (2013.01); *G06N 3/08* (2013.01); *G11C 11/54* (2013.01); *G11C 13/0021* (2013.01)

(58) Field of Classification Search
CPC ............ G06N 3/065; G06N 3/04; G06N 3/08; G06N 3/084; G06N 3/063; G06N 3/09;
(Continued)

(56) References Cited

U.S. PATENT DOCUMENTS 7,969,344 B1   6/2011  Mahafza
9,721,211 B2 * 8/2017  Nicholson ................ G06N 7/01
(Continued)

FOREIGN PATENT DOCUMENTS

CN       111737932 A     10/2020
WO    2017214507 A1     12/2017

OTHER PUBLICATIONS

R. B. Jacobs-Gedrim et al., "Impact of Linearity and Write Noise of Analog Resistive Memory Devices in a Neural Algorithm Accelerator," 2017 IEEE International Conference on Rebooting Computing, 2017, 15 pages.
(Continued)

*Primary Examiner* — Farley Abad
(74) *Attorney, Agent, or Firm* — Erik Johnson; Ryan, Mason & Lewis, LLP

(57) ABSTRACT

A system includes a processor, and a resistive processing resistive processing unit coupled to the processor. The resistive processing unit includes an array of cells, wherein the cells respectively include resistive devices, wherein at least a portion of the resistive devices are programmable to store weight values of a given matrix in the array of cells. When the given matrix is stored in the array of cells, the processor is configured to perform a weight extraction process. The weight extraction process applies a set of input vectors to the resistive processing unit to perform analog matrix-vector multiplication operations on the stored matrix, obtains a set of output vectors resulting from the analog matrix-vector multiplication operations, and determines weight values of the given matrix stored in the array of cells utilizing the set of input vectors and the set of output vectors.

20 Claims, 11 Drawing Sheets

(51) Int. Cl.
*G06N 3/08* (2023.01)
*G11C 11/54* (2006.01)
*G11C 13/00* (2006.01)

(58) Field of Classification Search
CPC ... G11C 11/54; G11C 13/0021; G11C 7/1006; G11C 7/16; G11C 13/0002; G11C 13/004
See application file for complete search history.

(56) References Cited

U.S. PATENT DOCUMENTS

| | | | |
|---|---|---|---|
| 10,319,439 B1* | 6/2019 | Li | G06N 3/084 |
| 10,830,800 B1 | 11/2020 | Cho et al. | |
| 2011/0238566 A1* | 9/2011 | Santos | G06Q 40/03 |
| | | | 705/38 |
| 2018/0005110 A1* | 1/2018 | Gokmen | G06N 3/063 |
| 2019/0080230 A1* | 3/2019 | Hatcher | G06F 7/5443 |
| 2020/0133829 A1 | 4/2020 | Zazo et al. | |
| 2020/0387775 A1* | 12/2020 | Nagata | G06N 3/0675 |
| 2021/0027121 A1* | 1/2021 | Zan | G06N 3/084 |
| 2021/0077718 A1* | 3/2021 | Jacks | A61M 5/1723 |
| 2022/0067358 A1* | 3/2022 | Stewart | G06F 18/214 |

OTHER PUBLICATIONS

N. Gong et al., "Signal and Noise Extraction from Analog Memory Elements for Neuromorphic Computing," Nature Communications, vol. 9, 2018, 8 pages.

P. Mell et al., "The NIST Definition of Cloud Computing," Recommendations of the National Institute of Standards and Technology, Special Publication 800-145, Sep. 2011, 7 pages.

U.S. Appl. No. 17/134,814 filed in the name of Tayfun Gokmen et al. on Dec. 28, 2020, and entitled "Matrix Inversion using Analog Resistive Crossbar Array Hardware."

* cited by examiner $y = W \times x$

FORWARD PASS $z = W^T \times \delta$

BACKWARD PASS $w_{ij} \leftarrow w_{ij} + \eta x_i \times \delta_j$

WEIGHT UPDATE

EXTRACTION OF WEIGHT VALUES IN RESISTIVE PROCESSING UNIT ARRAY

BACKGROUND

This disclosure relates generally to analog resistive processing systems for neuromorphic computing, and techniques for performing hardware accelerated numerical computing tasks using an analog resistive processing system. Information processing systems such as neuromorphic computing systems and artificial neural network systems are utilized in various applications such as machine learning and inference processing for cognitive recognition and computing. Such systems are hardware-based systems that generally include a large number of highly interconnected processing elements (referred to as "artificial neurons") which operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using an array of resistive processing unit (RPU) cells having tunable resistive memory devices (e.g., tunable conductance), wherein the conductance states of the RPU cells are encoded or otherwise mapped to the synaptic weights.

SUMMARY

Exemplary embodiments of the disclosure include systems, computer program products, and methods for extracting weight values stored in a resistive memory array of a resistive processing unit. In an exemplary embodiment, a system comprises a processor, and a resistive processing resistive processing unit coupled to the processor. The resistive processing unit comprises an array of cells, wherein the cells respectively comprise resistive devices, wherein at least a portion of the resistive devices are programmable to store weight values of a given matrix in the array of cells. When the given matrix is stored in the array of cells, the processor is configured to perform a weight extraction process. The weight extraction process comprises applying a set of input vectors to the resistive processing unit to perform analog matrix-vector multiplication operations on the stored matrix, obtaining a set of output vectors resulting from the analog matrix-vector multiplication operations, and determining weight values of the given matrix stored in the array of cells utilizing the set of input vectors and the set of output vectors.

Other embodiments will be described in the following detailed description of exemplary embodiments, which is to be read in conjunction with the accompanying figures.

DETAILED DESCRIPTION

Figure 1:
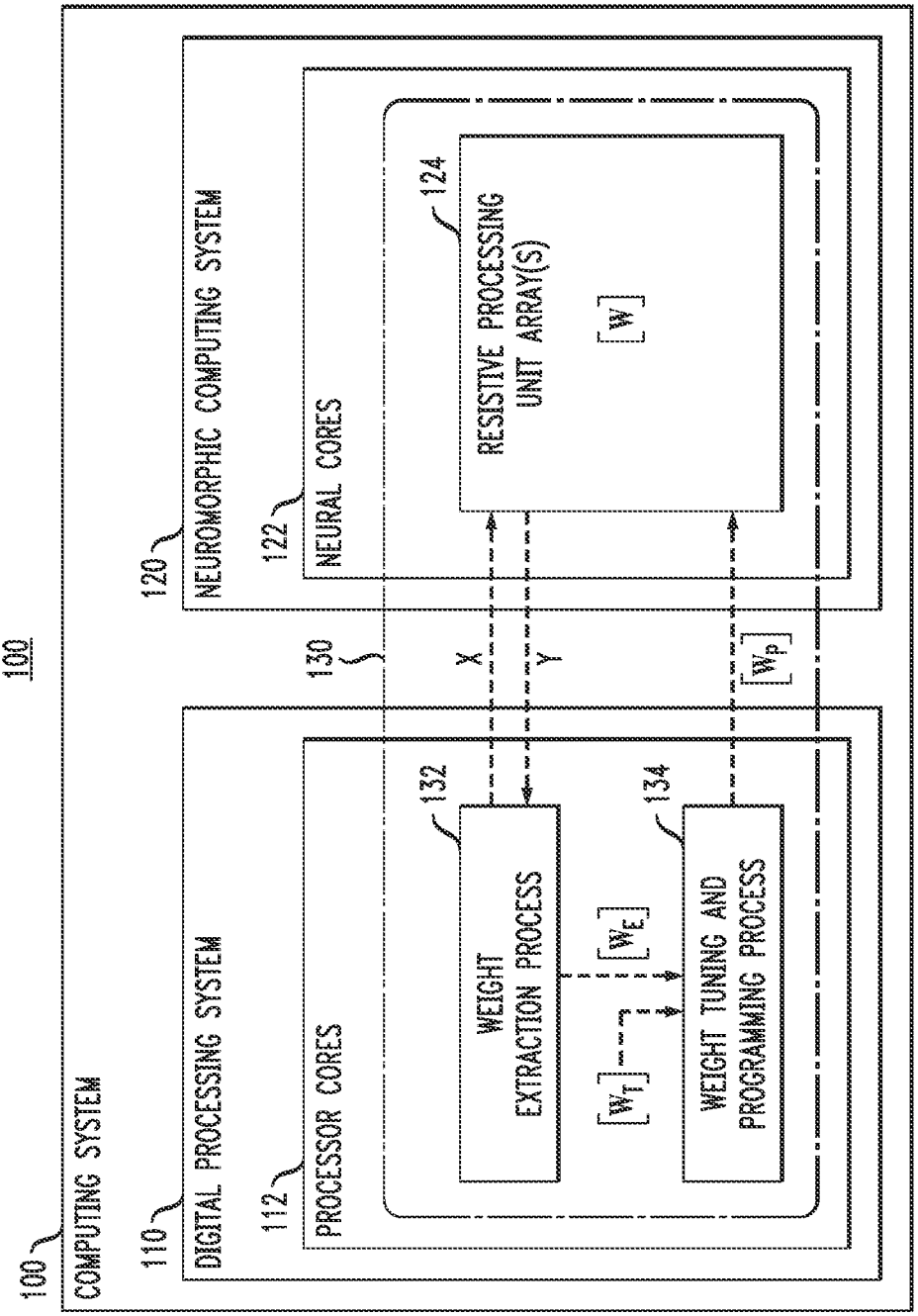
FIG. 1 schematically illustrates a computing system which implements a weight extraction process that is configured to accurately determine weight values of a weight matrix stored in a resistive processing unit array, according to an exemplary embodiment of the disclosure.

Embodiments of the disclosure will now be described in further detail with regard to systems and methods that are configured to enable accurate extraction of weight values of a weight matrix stored in a resistive processing unit array of a resistive processing unit system despite non-idealities (e.g., hardware offsets) of the resistive processing unit hardware. In addition, exemplary embodiments of the disclosure will be discussed in detail with regard to systems and methods for programming and tuning weight values of a weight matrix that is stored in a resistive processing unit array such that an effective behavior of the resistive processing unit hardware closely matches a target behavior of the resistive processing unit hardware with respect to performing in-memory computations, such as matrix-vector multiplication operations, by the resistive processing unit hardware.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 schematically illustrates a computing system which implements a weight extraction process that is configured to accurately determine weight values of a weight matrix stored in a resistive processing unit array, according to an exemplary embodiment of the disclosure. In particular, FIG. 1 schematically illustrates a computing system 100 which comprises a digital processing system 110, and a neuromorphic computing system 120. The digital processing system 110 comprises a plurality of processor cores 112. The neuromorphic computing system 120 comprises a plurality of neural cores 122. In some embodiments, the neuromorphic computing system 120 comprises a resistive processing unit (RPU) system in which each neural core 122 comprises one or more analog RPU arrays 124 (e.g., analog RPU crossbar arrays). The neural cores 122 are configured to support hardware acceleration for performing multiply-accumulate (MAC) operations in the analog domain for hardware accelerated computing of numerical operations such as matrix-vector multiplication operations, vector-matrix multiplication operations, vector-vector outer product operations, which are performed using the RPU arrays 124, for various neuromorphic computing applications such as training artificial neural networks, etc.

In some embodiments, the digital processing system 110 controls the execution of a process 130 which utilizes the neuromorphic computing system 120 to perform hardware accelerated computing operations. In some embodiments, the process 130 implements a training process to train one or more synaptic weight matrices of an artificial neural network, wherein the synaptic weight matrices are stored in the RPU arrays 124. In some embodiments, the process 130 comprises a weight extraction process 132, and a weight tuning and programming process 134. In some embodiments, the processes 132 and 134 are implemented as stand-alone processes to perform weight extraction and tuning operations with regard to weight matrices stored in the RPU arrays 124. In some embodiments, the processes 132 and 134 are implemented in conjunction with a training process to perform weight extraction and tuning operations with regard to trained synaptic weight matrices which results from a neural network training process, and which are stored in the RPU arrays 124. An exemplary training process will be described in further detail below in conjunction with, e.g., FIGS. 3A, 3B, and 3C.

The weight extraction process 132 implements methods that are configured to enable accurate extraction of weight values of a weight matrix W stored in a given RPU array of the RPU arrays 124 of the neural cores 122, despite non-idealities (e.g., hardware offsets) of the RPU hardware. In some embodiments, the weight extraction process 132 implements optimization techniques to minimize errors in the weight values of a given weight matrix W which are read from a given RPU array 124 (which stores the given weight matrix W) by utilizing a linear transformation between (i) a set of input vectors that are applied to the given RPU array, and (ii) a corresponding set of output vectors that are generated by the RPU performing matrix-vector multiplication operations. The matrix-vector multiplication operations involve multiplying the stored weight matrix W by each input vector X in the given set of input vectors to compute a corresponding output vector Y and generate a corresponding set of output vectors. As explained in further detail below, such techniques are configured to compute a matrix of effective weight values $W_E$ from the RPU hardware, which correspond to the stored weight matrix values W, wherein the computation of the effective weight values $W_E$ is configured to compensate for non-idealities associated with the RPU hardware. In effect, the computed effective weight values $W_E$ characterize the effective behavior of the RPU hardware with respect to, e.g., matrix-vector multiplication operations performed by the RPU hardware on the stored weight matrix W in the given RPU array. Exemplary modes of operation of the weight extraction process 132 will be discussed in further detail below in conjunction with, e.g., FIGS. 6, 7A, and 7B.

The weight tuning and programming process 134 implements methods that are configured to program and tune weight values of a weight matrix stored in an RPU array, according to an exemplary embodiment of the disclosure. As schematically illustrated in FIG. 1, the weight tuning and programming process 134 receives a matrix of target weight values $W_T$ from a given application and stores a matrix of programmed weight values $W_P$ in a given RPU array of the RPU arrays 124, wherein $W_P$ corresponds to $W_T$. The weight tuning and programming process 134 invokes the weight extraction process 132 to compute a matrix of effective weight values $W_E$ based on a current $W_P$ stored in the given RPU array. The weight tuning and programming process 134 utilizes $W_T$ and $W_E$ to update the matrix of programmed weight values $W_P$ stored in the given RPU array. The weight tuning and programming process 134 process is configured to fine tune the programmed weight values $W_P$ which are stored in the RPU array for the target weight values $W_T$ such that the final programmed weight matrix $W_P$ stored in the RPU array (which corresponds to the target matrix $W_T$) results in the effective behavior of the RPU hardware being closely matched to the target behavior of the RPU hardware with respect to, e.g., matrix-vector multiplication operations performed by the RPU hardware on the fine-tuned programmed weight matrix $W_P$ which represents the target weight matrix $W_T$. Exemplary modes of operation of weight tuning and programming process 134 will be discussed in further detail below in conjunction with, e.g., FIGS. 8 and 9.

The matrix of target weight values $W_T$ can be a software matrix that is provided by any type of application which utilizes matrices as computational objects to perform numerical operations for, e.g., solving linear equations, and performing other computations. For example, such applications include, but are not limited to, computing applications such as scientific computing applications, engineering applications, graphics rendering applications, signal processing applications, facial recognition applications, matrix diagonalization applications, a MIMO (Multiple-Input, Multiple-Output) system for wireless communications, cryptographic applications, etc. The application can invoke the process 130 and associated weight extraction, programming and tuning processes 132 and 134 to store matrix of target weight values $W_T$ in an RPU array to perform hardware accelerated computations using the stored matrix. In this manner, the process 130 will generate a fine-tuned matrix of programmed weight values $W_P$, which corresponds to the target weight matrix $W_T$, and utilize the fine-tuned matrix of programmed weight values $W_P$ in the RPU array to perform MAC computations associated with the target weight matrix $W_T$.

Figure 2:
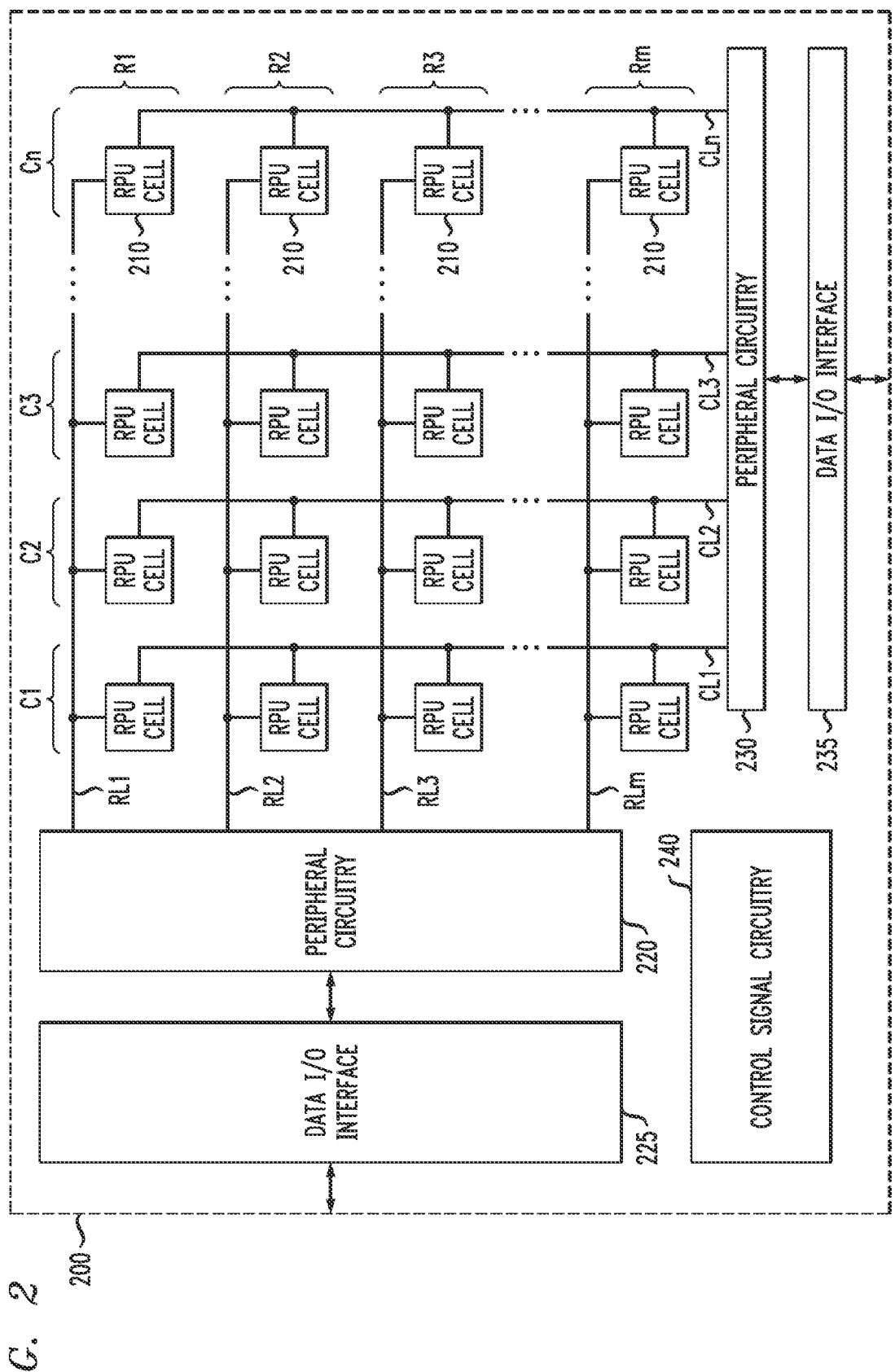
FIG. 2 schematically illustrates a resistive processing unit system which can be implemented in the system of FIG. 1, according to an exemplary embodiment of the disclosure.

FIG. 2 schematically illustrates a resistive processing unit system which can be implemented in the system of FIG. 1, according to an exemplary embodiment of the disclosure. For example, FIG. 2 schematically illustrates an exemplary embodiment of a neural core 122 and associated RPU array(s) 124 of the neuromorphic computing system 120 of FIG. 1. More specially, FIG. 2 schematically illustrates an RPU system 200 (e.g., neuromorphic computing system) which comprises a two-dimensional (2D) crossbar array of RPU cells 210 (alternatively referred to as RPU array) arranged in a plurality of rows R1, R2, R3, . . . , Rm, and a plurality of columns C1, C2, C3, . . . , Cn. The RPU cells 210 in each row R1, R2, R3, . . . , Rm are commonly connected to respective row control lines RL1, RL2, RL3, . . . , RLm (collectively, row control lines RL). The RPU cells 210 in each column C1, C2, C3, . . . , Cn are commonly connected to respective column control lines CL1, CL2, CL3, . . . , CLn (collectively, column control lines CL). Each RPU cell 210 is connected at (and between) a cross-point (or intersection) of a respective one of the row and column control lines. In an exemplary embodiment, the number of rows (m) and the number of columns (n) are the same (i.e., n=m). For example, in some embodiments, the computing system 200 comprises a 4,096×4,096 array of RPU cells 210.

The computing system 200 further comprises peripheral circuitry 220 connected to the row control lines RL1, RL2, RL3, . . . , RLm, as well peripheral circuitry 230 connected to the column control lines CL1, CL2, CL3, . . . , CLn. Further, the peripheral circuitry 220 is connected to a data input/output (I/O) interface block 225, and the peripheral circuitry 230 is connected to a data I/O interface block 235. The computing system 200 further comprises control signal circuitry 240 which comprises various types of circuit blocks such as power, clock, bias and timing circuitry to provide power distribution and control signals and clocking signals for operation of the peripheral circuitry 220 and 230 of the computing system 200.

In some embodiments, each RPU cell 210 in the RPU system 200 comprises a resistive element with a conductance value that is tunable. During operation, some or all of the RPU cells 210 in the computing system 200 comprise respective conductance values that are mapped to respective numerical matrix values of a given matrix W (e.g., computational matrix or synaptic weight matrix, etc.) that is stored in the array of RPU cells 210. In some embodiments, the resistive elements of the RPU cells 210 are implemented using resistive devices such as resistive switching devices (interfacial or filamentary switching devices), ReRAM, memristor devices, phase change memory (PCM) device, etc.) and other types of devices which have a tunable conductance (or tunable resistance level) which can be programmatically adjusted within a range of a plurality of different conductance levels to tune the weight of the RPU cell 210. In some embodiments, the variable conductance elements of the RPU cells 210 can be implemented using ferroelectric devices such as ferroelectric field-effect transistor devices. Furthermore, in some embodiments, the RPU cells 210 can be implemented using an analog CMOS-based framework in which each RPU cell 210 comprises a capacitor and a read transistor. With the analog CMOS-based framework, the capacitor serves as a memory element of the RPU cell 210 and stores a weight value in the form a capacitor voltage, and the capacitor voltage is applied to a gate terminal of the read transistor to modulate a channel resistance of the read transistor based on the level of the capacitor voltage, wherein the channel resistance of the read transistor represents the conductance of the RPU cell and is correlated to a level of a read current that is generated based on the channel resistance.

While the row control lines RL and column control lines CL are each shown in FIG. 2 as a single line for ease of illustration, it is to be understood that each row and column control line can include two or more control lines connected to the RPU cells 210 in the respective rows and columns, depending on the implementation and the specific architecture of the RPU cells 210. For example, in some embodiments, each row control line RL can include a complementary pair of word lines for a given RPU cell 210. Moreover, each column control line CL may comprise multiple control lines including, e.g., one or more source lines (SL) and one or more bit lines (BL).

The peripheral circuitry 220 and 230 comprises various circuit blocks which are connected to the respective rows and columns in the 2D array of RPU cells 210, and which are configured to perform various analog, in-memory computation operations such as vector-matrix multiply functions, matrix-vector multiply functions, and outer product update operations, etc., to provide hardware accelerated computation operations as discussed herein. For example, in some embodiments, to support RPU cell read/sensing operations (e.g., read a weight value of a given RPU cell 210), the peripheral circuitry 220 and 230 comprises pulse-width modulation (PWM) circuitry and read pulse driver circuitry, which is configured to generate and apply PWM read pulses to the RPU cells 210 in response to digital input vector values (read input values) received during different operations. More specifically, in some embodiments, the peripheral circuitry 220 and 230 comprises digital-to-analog (D/A) converter circuitry that is configured to receive a digital input vector (to be applied to rows or columns) and convert the elements of the digital input vector into analog input vector values that are represented by input voltage voltages of varying pulse width. In some embodiments, a time-encoding scheme is used when input vectors are represented by fixed amplitude Vin=1 V pulses with a tunable duration (e.g., pulse duration is a multiple of 1 ns and is proportional to the value of the input vector). The input voltages applied to rows (or columns) generate output vector values which are represented by output currents, wherein the stored weights/values of the RPU cells 210 are essentially read out by measuring the output currents.

The peripheral circuitry 220 and 230 further comprises current integrator circuitry and analog-to-digital (A/D) converter circuitry to integrate read currents ($I_{READ}$) which are output and accumulated from the connected RPU cells 210 and convert the integrated currents into digital values (read output values) for subsequent computation. In particular, the currents generated by the RPU cells 210 are summed on the columns (or rows) and the summed current is integrated over a measurement time, tmeas, by current readout circuitry of the peripheral circuitry 220 and 230. The current readout circuitry comprises current integrators and analog-to-digital (A/D) converters. In some embodiments, each current integrator comprises an operational amplifier that integrates the current output from a given column (or row) (or differential currents from pairs of RPU cells implementing negative and positive weights) on a capacitor, and an analog-to-digital (A/D) converter converts the integrated current (e.g., an analog value) to a digital value.

The data I/O interfaces 225 and 235 are configured to interface with a digital processing core, wherein the digital processing core is configured to process input/outputs to the RPU system 200 (e.g., neural core) and route data between different RPU arrays. The data I/O interfaces 225 and 235 are configured to (i) receive external control signals and data from a digital processing core and provide the received control signals and data to the peripheral circuitry 220 and 230, and (ii) receive digital read output values from peripheral circuitry 220 and 230, and send the digital read output values to a digital processing core for processing. In some embodiments, the digital processing cores implement non-linear function circuitry which calculates activation functions (e.g., sigmoid neuron function, softmax, etc.) and other arithmetical operations on data that is to be provided to a next or previous layer of an artificial neural network.

The RPU system 200 of FIG. 2 can be configured to operate as an in-memory computing system or computational memory system in which an RPU array is utilized for a dual purpose of storing data and processing the data to perform some computational tasks. As noted above, neuromorphic computing systems and artificial neural network systems are types of in-memory computing systems in which artificial neurons are connected using artificial synaptic devices to provide synaptic weights which represent the strength of connection between two artificial neurons. The synaptic weights can be implemented using tunable resistive memory devices, wherein the variable conductance states are used to represent the synaptic weights and to perform computations (e.g., matrix-vector multiplication operations). The conductance states of the analog resistive memory devices are encoded or otherwise mapped to synaptic weights.

Various types of artificial neural networks, such as deep neural networks (DNNs) and convolutional neural networks (CNNs) implement neuromorphic computing architectures for machine learning applications such as image recognition, object recognition, speech recognition, etc. The in-memory computations associated with such neural networks include, e.g., training computations in which the synaptic weights of the resistive memory cells are optimized by processing a training dataset, and forward inference computations in which the trained neural networks are used for to process input data for purposes of, e.g., classifying the input data, predicting events based on the input data, etc.

DNN training generally relies on a backpropagation algorithm which includes three repeating cycles: forward, backward and weight update, which are repeated many times until a convergence criterion is met. The forward and backward cycles mainly involve performing matrix-vector multiplication in forward and backward directions. The weight update involves calculating a vector-vector outer product which consists of a multiplication operation and an incremental weight update to be performed locally in each resistive memory cell within the RPU array. As is known in the art, fully connected DNNs comprise stacks of fully connected layers such that a signal propagates from an input layer to an output layer by going through series of linear and non-linear transformations. The entire DNN expresses a single differentiable error function that maps the input data to class scores at the output layer. Typically, a DNN is trained using a simple stochastic gradient decent (SGD) scheme, in which an error gradient with respect to each parameter is calculated using the backpropagation algorithm.

Figure 3A:
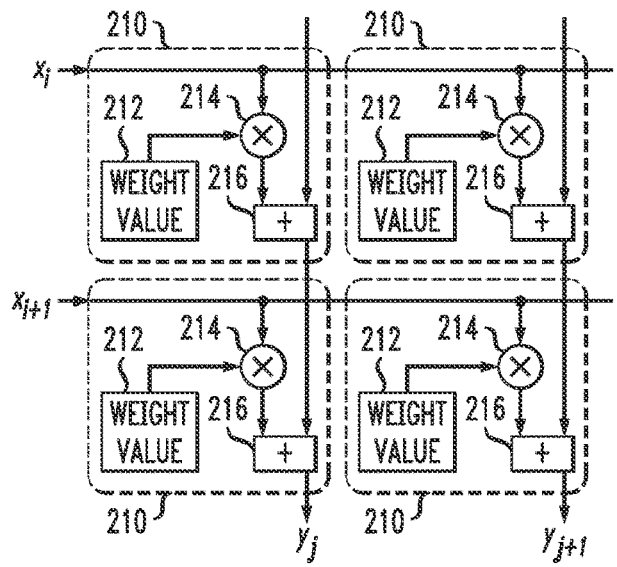
FIGS. 3A, 3B, and 3C schematically illustrate respective forward pass, backward pass, and weight update operations of an exemplary training process for training synaptic weights of an artificial neural network using the systems of FIGS. 1 and 2, according to an exemplary embodiment of the disclosure.
Figure 3B:
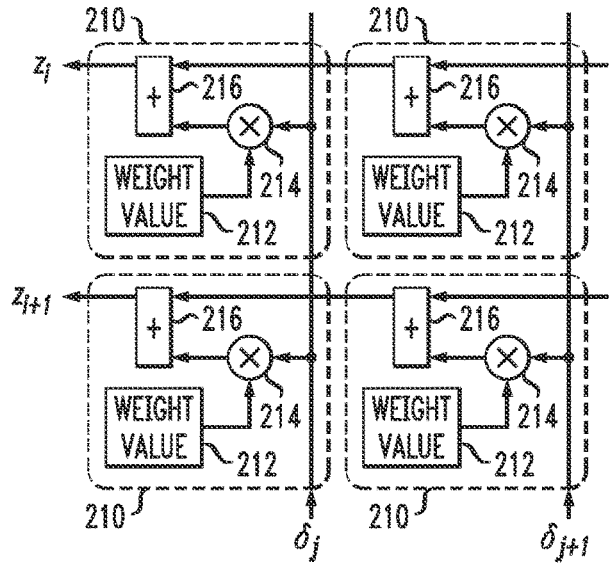
Figure 3C:
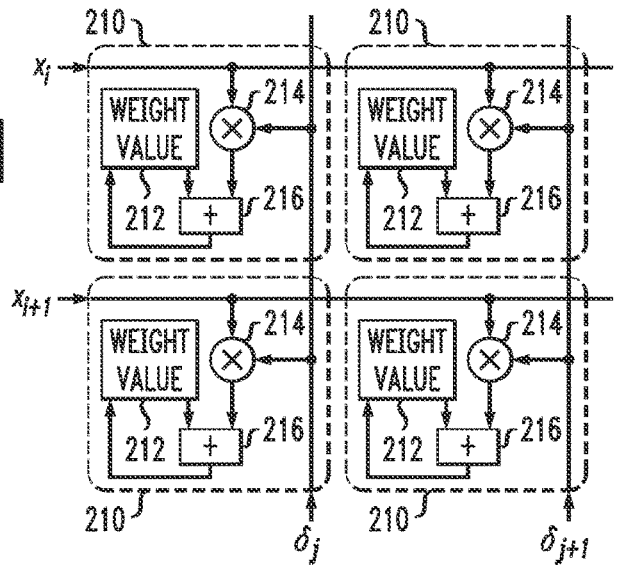

FIGS. 3A, 3B, and 3C schematically illustrate respective forward pass, backward pass, and weight update operations of an exemplary training process for training synaptic weights of an artificial neural network using the systems of FIGS. 1 and 2, according to an exemplary embodiment of the disclosure. For illustrative purposes, FIGS. 3A, 3B, and 3C schematically illustrate components of each RPU cell 210 in the RPU array of FIG. 2. In particular, each RPU cell 210 comprises a matrix element 212 of a given matrix W stored in the RPU array. The matrix elements 212 represent matrix values of the given matrix W, wherein the matrix values are mapped to conductance values of the RPU cells 210 such that the matrix elements 212 stored in the RPU cells 210 are encoded by the respective conductance values of the RPU cells 210. In particular, the conductance values $g_{ij}$ in the RPU array form a matrix W of weight values $w_{ij}$. Each RPU cell 210 is configured to perform a local multiplication operation 214 and a local summation operation 216 to support the forward pass, backward pass, and weight update operations of a training process to train the weight values 212 stored in the RPU cells 210 of the RPU array.

The forward pass operation for training an artificial neural network is performed to calculate neuron activations of a downstream layer (e.g., hidden layer or output layer) based on (i) neuron activations of an upstream layer (e.g., input layer or hidden layer) and (ii) the synaptic weights that connect the neurons of the upstream layer to the neurons of the downstream layer. For a single fully connected layer where, e.g., n input neurons are connected to m output (or hidden) neurons, the forward pass cycle (FIG. 3A) involves computing a matrix-vector multiplication y=Wx, where the vector x of length n, i.e., $x=[x_1, x_2, \ldots, x_n]$ represents the activities of the input neurons (e.g., upstream neuron excitation) and the matrix W of size m×n stores the weight values between each pair of input and output neurons. The resulting digital output vector y of length m, $y=y_1, y_2, \ldots, y_m$, is further processed by performing a non-linear activation on each of the elements and then transmitted to the next downstream layer to continue the forward propagation operation. As data propagates forward through the neural network, vector-matrix multiplications are performed, wherein the hidden neurons/nodes take the inputs, perform a non-linear transformation, and then send the results to the next weight matrix. This process continues until the data reaches an output layer (of the artificial neural network) comprising output neurons/nodes. The output neurons/nodes evaluate classification errors, and generate classification error signals δ which are propagated back through the neural network using backward pass operations. The error signals S can be determined as a difference between the results of the forward inference classification (estimated labels) and the correct labels at the output layer of the artificial neural network.

As schematically shown in FIG. 3B, the backward pass operation for training the artificial neural network is performed in a manner that is similar to the forward pass operation (FIG. 3A) except that a vector of error signals $\delta=[\delta_1, \delta_2, \ldots, \delta_n]$ is backpropagated from the output layer to the input layer of the artificial neural network. The backward pass cycle (FIG. 3B) on a single layer also involves a matrix-vector multiplication on the transpose of a weight matrix, $z=W^T\delta$, where $W^T$ denotes the transpose of the weight matrix W, where the vector δ of length m represents the error calculated by the output neurons, and where the vector z of length n is further processed using the derivative of neuron non-linearity and then passed down to the previous layer. The digital output signal $z=z_1, z_2, \ldots, z_n$ is then processed and transmitted to the next upstream layer to continue the backward propagation operation. The backward propagation process continues until the error signals reach the input layer of the artificial neural network.

After the backward pass operation is completed on a given RPU array which stores a given synaptic weight matrix W, a weight update process (as schematically shown in FIG. 3C) is performed to tune the conductance values of the RPU cells of the given RPU array (and thus update the weight values of the given synaptic weight matrix W) based on the forward-propagated digital signals $x_1, x_2, \ldots, x_m$ and the backward-propagated digital error signals $\delta_1, \delta_2, \ldots, \delta_n$, that were previously input to the given RPU array during the forward and backward pass operations. Once the error signal values (or delta values) have been integrated for a given neuron layer, that layer is ready for weight update. The update process that is performed on the given RPU array can be pipelined with the backward propagation of the error vector δ through additional upstream layers of the neural network. In some embodiments, the backward propagation from the first hidden layer back to the input layer is performed, but not required as the neurons in the input layer have no upstream synapses, so the highest layer that uses the δ error values is the first hidden layer.

More specifically, as schematically shown in FIG. 3C, the weight update operation involves updating the weight matrix W in the given RPU array by performing an outer product of the two vectors that are used in the forward and the backward cycles. In particular, implementing the weight update for the given RPU array involves performing a vector-vector outer product operation which consists of a multiplication operation 214 and an incremental weight update to be performed locally in each RPU cell 210, i.e., $w_{ij} \leftarrow w_{ij} + \eta x_i \times \delta_j$, where $w_{ij}$ represents the weight value for the $i^{th}$ row and the $j^{th}$ column (for simplicity layer index is omitted), where $x_i$ is the activity at the input neuron, $\delta_j$ is the error computed by the output neuron, and where η denotes a global learning rate.

In some embodiments, to determine the product of the xi and δj vectors for the weight update operation, stochastic translator circuitry in the peripheral circuitry 220 and 230 can be utilized to generate stochastic bit streams that represent the input vectors xi and δj. The stochastic bits streams for the vectors xi and δj are fed through rows and columns in the RPU array, wherein the conductance of a given RPU cell 210 will change depending on the coincidence of the xi and δj stochastic pulse streams input to the given RPU cell 210. The vector cross product operations for the weight update operation are implemented based on the known concept that that coincidence detection (using an AND logic gate operation) of stochastic streams representing real numbers is equivalent to a multiplication operation. All three operating modes described above allow the RPU cells of the synaptic weight arrays of the artificial neural network to be active in all three cycles and, thus, enable a very efficient implementation of the backpropagation algorithm to compute updated weight values of the RPU cells during a DNN training process.

Figure 4:
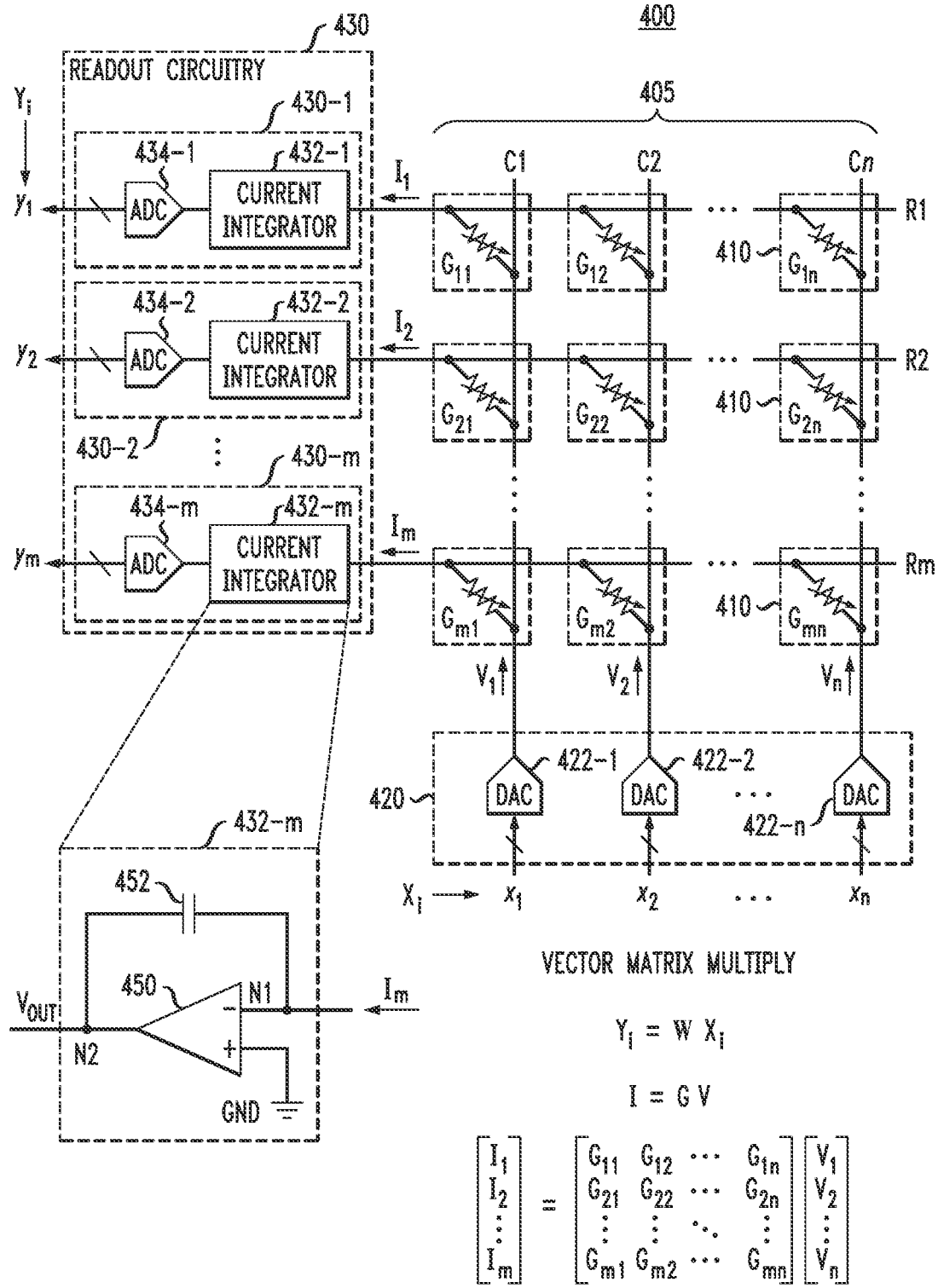
FIG. 4 schematically illustrates a method for configuring a resistive processing unit system comprising a resistive processing unit array to perform an analog matrix-vector multiplication operation on a weight matrix stored in the resistive processing unit array, according to an exemplary embodiment of the disclosure.

FIG. 4 schematically illustrates a method for configuring an RPU system comprising an RPU array to perform an analog matrix-vector multiplication operation on a weight matrix stored in the RPU array, according to an exemplary embodiment of the disclosure. In particular, FIG. 4 schematically illustrates an RPU computing system 400 which comprises a crossbar array of RPU cells 405 (or RPU array 405), wherein each RPU cell 410 in the RPU array 405 comprises an analog non-volatile resistive element (represented as a variable resistor having a tunable conductance G) at the intersection of each row (R1, R2, . . . , Rm) and column (C1, C2, . . . , Cn). As depicted in FIG. 4, the RPU array 405 comprises a matrix of conductance values Gij which are mapped to matrix values of a given matrix (e.g., weight matrix W), which are encoded by the conductance values Gij (where i represents a row index and j denotes a column index) of the respective RPU cells 410. In an exemplary embodiment, the given matrix is stored in the RPU array 405 wherein the $i^{th}$ row of RPU cells 410 represents the $i^{th}$ row of the given matrix, and wherein the $j^{th}$ column of RPU cells 410 represents the $j^{th}$ column of the given matrix.

To perform a matrix-vector multiplication operation, multiplexer circuitry in the peripheral circuitry of the computing system 400 is configured to selectively connect column line driver circuitry 420 to the column lines C1, C2, . . . , Cn. The line driver circuitry 420 comprises plurality of digital-to-analog (DAC) circuit blocks 422-1, 422-2, . . . , 422-n (collectively DAC circuit blocks 422) which are connected to respective column lines C1, C2, . . . , Cn. In addition, multiplexer circuitry in the peripheral circuitry of the computing system 400 is configured to selectively connect readout circuitry 430 to the row lines R1, R2, . . . , Rm. The readout circuitry 430 comprises a plurality of readout circuit blocks 430-1, 430-2, . . . , 430-m, which are connected to respective row lines R1, R2, . . . , Rm. The readout circuit blocks 430-1, 430-2, . . . , 430-m comprise respective current integrator circuitry 432-1, 432-2, . . . , 432-m, and respective analog-to-digital (ADC) circuitry 434-1, 434-2, . . . , 434-m.

As further schematically shown in FIG. 4 for illustrative purposes, the current integrator circuitry 432-m comprises an operational transconductance amplifier (OTA) 450, and an integrating capacitor 452. The integrating capacitor 452 is connected in a negative feedback path between input and output nodes N1 and N2 of the operational amplifier 450. The operational amplifier 450 comprises a non-inverting input connected to ground (GND) voltage, an inverting input (denoted node N1) coupled to an output of the row line $R_m$, and an output (denoted node N2) connected to an input of the ADC circuit 434-m. The integrating capacitor 452 provides negative capacitive feedback to allow the operational amplifier 450 to convert an input current (e.g., aggregate row current $I_m$) to an output voltage $V_{OUT}$ on the output node N2. More specifically, the current integrator circuit 432-$m$ performs an integration operation over an integration period ($T_{MEAS}$) to convert an input current at the input node N1 of the current integrator circuit 432-$m$ to an analog voltage $V_{OUT}$ at the output node N2 of the current integrator circuit 432-$m$. At the end of an integration period, the ADC circuit 434-$m$ latches in the output voltage $V_{OUT}$ generated at the output node N2, and quantizes the output voltage $V_{OUT}$ to generate a digital output signal. It is to be noted that each block of the current integrator circuitry shown in FIG. 4 implements the same framework shown for the current integrator circuitry 432-$m$.

In the exemplary configuration of FIG. 4, assuming a given matrix W is stored in the RPU array 405 such that the $i^{th}$ row of RPU cells represents the $i^{th}$ row of the stored matrix W, and the $j^{th}$ column of RPU cells represents the $j^{th}$ column of the stored matrix W, a matrix-vector multiplication process $Y_i = WX_i$, is performed by inputting a digital vector $X_i = [x_1, x_2, \ldots, x_n]$ to the column lines of the RPU array 405. The digital signals $x_1, x_2, \ldots, x_n$ are input to respective DAC circuit blocks 422-1, 422-2, . . . , 422-$n$ which generate analog voltages $V_1, V_2, \ldots, V_n$ at the input to the respective column lines C1, C2, . . . , Cn, which are proportional to the input vector values $x_1, x_2, \ldots, x_n$, respectively. In some embodiments, the DAC circuit blocks 422-1, 422-2, . . . , 422-$n$ each comprise pulse-width modulation circuitry and driver circuitry which is configured to generate pulse-width modulated (PWM) read pulses $V_1, V_2, \ldots, V_n$ that are applied to the respective column lines C1, C2, . . . , Cn.

More specifically, in some embodiments, as noted above, the DAC circuit blocks 422-1, 422-2, . . . , 422-$n$ are configured to perform a digital-to-analog conversion process using a time-encoding scheme where the elements $x_1, x_2, \ldots, x_n$ of the input vector $X_i$ are represented by fixed amplitude pulses (e.g., V=1V) with a tunable duration, wherein the pulse duration is a multiple of a prespecified time period (e.g., 1 nanosecond) and is proportional to the value of the elements $x_1, x_2, \ldots, x_n$ of the input vector $X_i$. For example, a given digital input value of 0.5 can be represented by a voltage pulse of 4 ns, while a digital input value of 1 can be represented by a voltage pulse of 80 ns (e.g., a digital input value of 1 can be encoded to an analog voltage pulse with a pulse duration that is equal to the integration time $T_{meas}$).

To perform a matrix-vector multiplication, the analog input voltages $V_1, V_2, \ldots, V_n$ (e.g., pulses), are applied to the column lines C1, C2, . . . , Cn, wherein each RPU cell 410 generates a corresponding read current $I_{READ} = V_j \times G_{ij}$ (based on Ohm's law), wherein $V_j$ denotes the analog input voltage applied to the given RPU cell 410 on the given column j and wherein Gij denotes the conductance value of the given RPU cell 410 (at the given row i and column j). As shown in FIG. 4, the read currents that are generated by the RPU cells 410 on each row i are summed together (based on Kirchhoff's current law) to generate respective currents $I_1, I_2, \ldots, I_m$ at the output of the respective rows R1, R2, . . . , Rm. In this manner, the resulting row currents $I_1, I_2, \ldots, I_m$ represent the result of a matrix-vector multiplication operation that is performed, wherein the matrix W (which is represented by the conductance matrix G of conductance values Gij) is multiplied by the input analog voltage vector $[V_1, V_2, \ldots, V_n]$ to generate and output an analog current vector $[I_1, I_2, \ldots, I_m]$, as illustrated in FIG. 4. In particular, a given row current $I_i$ is computed as $I_i = \Sigma_{j=1}^{n}$ $V_j G_{ij}$. For example, the row current $I_1$ for the first row R1 is determined as $I_1 = (V_1 G_{11} + V_2 G_{12} +, \ldots, +V_n G_{1n})$.

The resulting aggregate read currents $I_1, I_2, \ldots, I_m$ at the output of the respective rows R1, R2, . . . , Rm are input to respective readout circuit blocks 430-1, 430-2, . . . , 430-$m$ of the readout circuitry 430. The aggregate read currents $I_1, I_2, \ldots, I_m$ are integrated by the respective current integrator circuits 432-1, 432-2, . . . , 432-$m$ to generate respective output voltages, which are quantized by the respective ADC circuits 434-1, 434-2, . . . , 434-$m$ to generate a resulting output vector $Y_i = [y_1, y_2, \ldots, y_m]$, which represents the result of the matrix-vector multiplication operation.

The exemplary embodiment of FIG. 4 schematically illustrates a process for performing a matrix-vector multiplication operation $Y_i = WX_i$ wherein (i) the matrix W is stored in the RPU array 405 such that the $i^{th}$ row of RPU cells represents the $i^{th}$ row of the matrix W, and the $j^{th}$ column of RPU cells represents the $j^{th}$ column of the matrix W, (ii) the input vector $X_i$ is input to the columns, and (iii) the resulting output vector $Y_i$ is generated at the output of the rows. In other embodiments, the same matrix-vector multiplication operation can be performed by (i) storing a transpose matrix $W^T$ of the matrix W in the RPU array 405 such that the $i^{th}$ row of the matrix W is stored in the RPU array 405 as the $j^{th}$ column of the transpose matrix $W^T$, (ii) applying the input vector $X_i$ to the rows, and (iii) reading the resulting output vector $Y_i$ at the output of the columns.

Figure 5A:
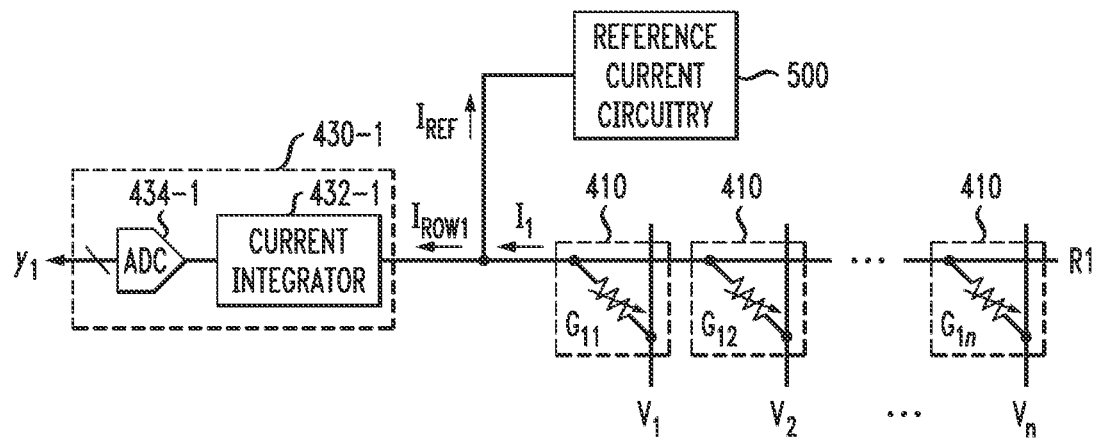
FIG. 5A schematically illustrates a method for configuring a resistive processing unit system comprising a resistive processing unit array to perform an analog matrix-vector multiplication operation on a weight matrix stored in the resistive processing array using signed matrix values, according to an exemplary embodiment of the disclosure.
Figure 5B:
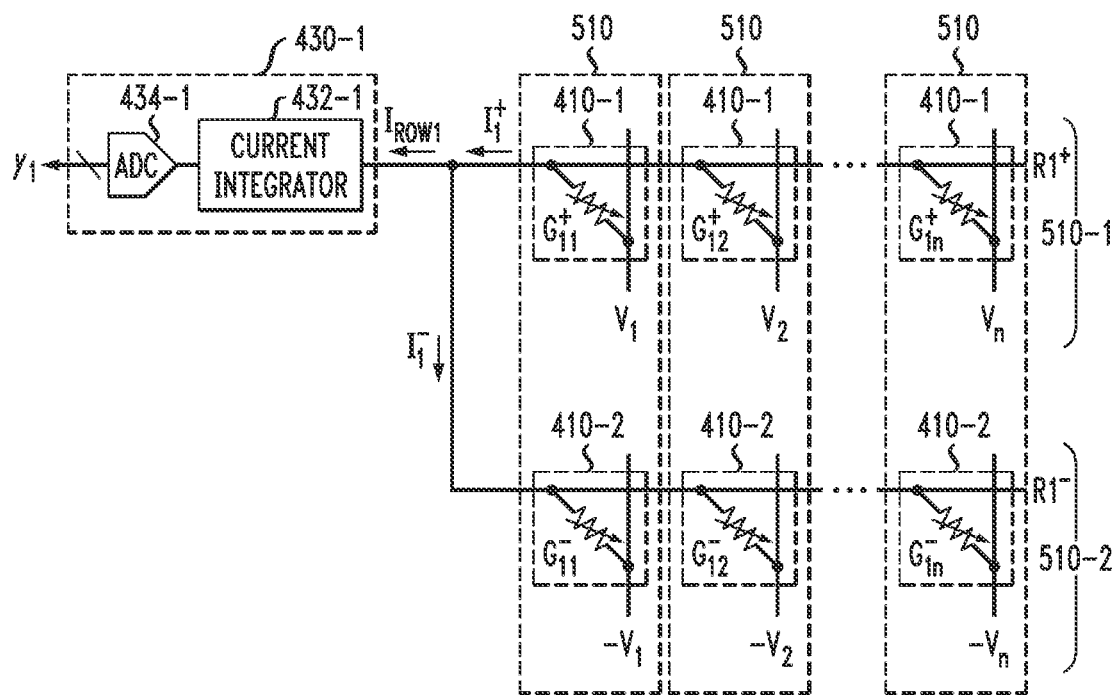
FIG. 5B schematically illustrates a method for configuring a resistive processing unit system comprising a resistive processing unit array to perform an analog matrix-vector multiplication operation on a weight matrix stored in the resistive processing unit array using signed matrix values, according to another exemplary embodiment of the disclosure.

While FIG. 4 schematically illustrates an exemplary method performing a matrix-vector multiplication operation using a single RPU array, other techniques can be implemented to perform a matrix-vector multiplication operation using "signed weights." For example, FIGS. 5A and 5B schematically illustrate methods for configuring an RPU system comprising an RPU array to perform an analog matrix-vector multiplication operation on a weight matrix stored in the RPU array using signed weight values, according to alternate exemplary embodiments of the disclosure. For illustrative purposes, the exemplary embodiments of FIGS. 5A and 5B will be discussed in the context of extending the RPU system 400 of FIG. 4 to enable the use of signed weights.

More specifically, FIG. 5A schematically illustrates a method for generating a row current during a matrix-vector multiplication operation using a reference current ($I_{REF}$) that is generated by a reference current circuit 500 to enable "signed weights." For ease of illustration, FIG. 5A shows only the first row R1 and the associated readout circuit block 430-1 the RPU system 400 of FIG. 4. FIG. 5A schematically illustrates a differential read scheme in which a row current $I_{ROW1}$ that is input to the readout circuit block 430-1 is determined as $I_{ROW1} = I_1 - I_{REF}$. With this differential scheme, the row current $I_{ROW1}$ will have (i) a magnitude (which corresponds to an aggregate current or an individual weight value) and (ii) a sign (+, −, 0). The sign of the row current $I_{ROW1}$ will depend on the whether $I_1$ is greater than, equal to, or less than, the reference current $I_{REF}$. A positive sign ($I_{ROW1} > 0$) will be obtained when $I_1 > I_{REF}$. A zero value ($I_{ROW1} = 0$) will be obtained when $I_1 = I_{REF}$. A negative sign ($I_{ROW1} < 0$) will be obtained when $I_1 < I_{REF}$. While the reference current circuitry 500 is generically illustrated in FIG. 5A, the reference current circuitry 500 can be implemented using known techniques. For example, in some embodiments, the reference current circuitry 500 comprises a fixed current source which is configured to generate a reference current $I_{REF}$ with a known fixed magnitude that is selected for the given application.

Next, FIG. 5B schematically illustrates a method for generating a row current $I_{ROW1}$ using different row currents and $I_1^+$ from corresponding rows $R1^+$ and $R1^-$ of two separate RPU arrays 510-1 and 510-2, wherein the conductance is determined as $(G^+-G^-)$. More specifically, FIG. 5B schematically illustrates a differential read scheme in which the row current $I_{ROW1}$ that is input to the readout circuit block 430-1 is determined as $I_{ROW1}=I_1^+-I_1^-$. As shown in FIG. 5B, each RPU cell 510 comprises two unit RPU cells 410-1 and 410-2 from two separate RPU arrays 510-1 and 510-2, respectively. With this differential scheme, the row current $I_{ROW1}$ will have a magnitude and sign, wherein the sign of the row current $I_{ROW1}$ will depend on the whether $I_1$ is greater than, equal to, or less than, $I_1^-$. A positive sign $(I_{ROW1}>0)$ will be obtained when $I_1>I_1^-$. A zero value $(I_{ROW1}=0)$ will be obtained when $I_1=I_1^-$. A negative sign $(I_{ROW1}<0)$ will be obtained when $I_1<I_1^-$.

More specifically, in the exemplary embodiment of FIG. 5B, as noted above, each RPU cell 510 comprises two unit RPU cells 410-1 and 410-2 which have respective conductance values $G_{ij}^+$ and $G_{ij}^-$, wherein the conductance value of a given RPU cell 510 is determined as the difference between the respective conductance values, i.e., $G_{ij}=G_{ij}^+-G_{ij}^-$ where i and j are indices within the RPU arrays 510-1 and 510-2. In this way, negative and positive weights can be readily encoded using positive-only conductance values. In other words, since the conductance values of the resistive devices of the RPU cells can only be positive, the differential scheme in FIG. 5B implements a pair of identical RPU arrays to encode positive $(G_{ij}^+)$ and negative $(G_{ij}^-)$ matrix values, wherein the matrix value $(G_{ij})$ of a given RPU cell is proportional to a difference of two conductance values stored in two corresponding devices $(G_{ij}^+-G_{ij}^-)$ located in identical positions of the pair of RPU arrays 510-1 and 510-2. In some embodiments, the two RPU arrays 510-1 and 510-2 can be stacked on top of each other in a back-end-of-line metallization structure of a chip. In this instance, a single RPU tile is deemed a pair of RPU arrays with the peripheral circuitry that support the operations of the singe RPU tile.

A shown in FIG. 5B, positive voltage pulses $(V_1, V_2, \ldots, V_n)$ and corresponding negative voltage pulses $(-V_1, -V_2, \ldots, -V_n)$ are supplied separately to the RPU cells 410-1 and 410-2 in corresponding rows in the identical RPU arrays 510-1 and 510-2 that are used to encode positive and negative matrix values. The row currents $I_1^+$ and $I_1^-$ that are output from the corresponding first rows $R1^+$ and $R1^-$ in the respective RPU arrays 510-1 and 510-2 are combined to generate a differential current $I_{ROW1}$ which is input to the readout circuit block 430-1 connected to the corresponding first rows $R1^+$ and $R1^-$.

In some embodiments where complex matrices are implemented (e.g., a complex matrix which comprises a real part and an imaginary part), the RPU framework of FIG. 5B can be implemented to store real and imaginary matrix values in two distinct RPU arrays. For example, in the exemplary embodiment of FIG. 5B, the first RPU array 510-1 can be configured to store the real matrix values of a complex matrix, while the corresponding second RPU array 510-2 is configured to store the imaginary matrix values of the complect matrix. In this manner, the respective parts can then be processed separately, making it possible to obtain a conjugate transpose $A^*$ and a pseudoinverse $A^\dagger$. In other embodiments, each RPU cell 510 in FIG. 5B can be implemented using two adjacent unit cells 410-1 and 410-2 on the same RPU array. For example, in FIG. 5B, the rows implemented $R1^+$ and $R1^-$ can be two adjacent rows of the same RPU array (e.g., same RPU tile). In such configuration, the control lines of the RPU array would be configured to support such RPU cell configuration, as is understood by those of ordinary skill in the art.

As noted above, a weight extraction process (e.g., process 132, FIG. 1) according to an exemplary embodiment of the disclosure is configured to extract weight values from RPU hardware with high precision despite the fact that the RPU hardware can be noisy and have limited precision. For example, when performing a matrix-vector multiplication operation using the RPU system 400 (FIG. 4), applying an input vector $X_i$ to the RPU system 400 results in an output vector $Y_i$, where ideally, $Y_i=WX_i$, where W denotes a matrix of encoded weights stored in the RPU array 405. However, due to noise, mismatches, offsets, etc., in the RPU hardware, the value of the resulting output vector $Y_i$ will actually be $Y_i=WX_i+b+f(x)+noise$, where b, f(x), and noise denote various error components that may arise due to the analog RPU hardware.

More specifically, the error component b collectively represents linear errors (e.g., offsets) associated with the RPU hardware. For example, referring to the RPU hardware shown in FIGS. 4, 5A, and 5B, such linear errors result from, e.g., voltage drops due to series resistance of row and column lines in the RPU array 405 and leakage, mismatches in the DAC circuitry 420 resulting in mismatches in the input voltages that are generated from the digital input vectors, mismatches in the readout circuitry 430 (e.g., mismatches in the integration capacitors 452, input voltage offsets of the operational amplifiers 450, mismatches in the ADC circuit blocks 434, ADC offset errors of the ADC circuit blocks 434, etc.), and current mirror offset of current mirrors that implement the reference current circuitry 500, and other types of hardware offset errors. Further, the error component f(x) collectively represents non-linear behaviors of the RPU hardware resulting from, e.g., degraded performance of the operational amplifiers or power supplies, non-linearities of the current mirrors, ADCs, integration capacitors, resistances, etc. The error component noise denotes cycle-to-cycle noise of the RPU hardware such as thermal noise.

When performing a matrix-vector multiplication operation $Y_i=WX_i$, the error components b, f(x), and noise result in a misrepresentation of the actual weight values of the weight matrix W because such error components b, f(x), and noise cause errors/variations in, e.g., (i) the analog input voltages that are applied to the RPU array, (ii) the analog output currents that are generated by the RPU array, and (iii) the resulting digital output vector $Y_i$ generated from the analog output currents. In this regard, techniques that read weight values of an RPU row-by-row, or which otherwise attempt to read the actual conductance values of the RPU cells, result in the extraction of inaccurate weight values due to such error components, wherein the extracted weight values do not match the ground truth (e.g., a weight values of a target weight matrix $W_T$).

In accordance with exemplary embodiments, techniques are provided to accurately extract weight values from RPU hardware despite non-idealities of the RPU hardware. In general, optimization techniques are utilized to minimize errors in the weight values of a weight matrix W, which are read from a given RPU array (which stores the weight matrix W) by utilizing a linear transformation between (i) a set of input vectors X that are applied to the given RPU array, and (ii) a corresponding set of output vectors Y that are generated by the RPU hardware performing matrix-vector multiplication operations. More specifically, techniques are provided to extract effective weight values $W_E$ from the RPU hardware in which the computation of the effective weight values $W_E$ is configured to compensate/correct the non-idealities associated with the RPU hardware. For example, in some embodiments, the effective weight values $W_E$ comprise values that minimize an objective function such as a multivariate linear regression function. In this regard, in some embodiments, the effective weight values $W_E$ of a given weight matrix W stored in an RPU array are determined by performing a multivariate linear regression computation based on (i) a set of input vectors X that are applied to a given RPU array, and (ii) a corresponding set of output vectors Y that are generated by the RPU hardware performing matrix-vector multiplication operations.

In some embodiments, the multivariate linear regression computation is configured to relate the set of input vectors X and corresponding set of resulting output vectors Y to the given weight matrix W stored in an RPU array such that Y=WX+b. In this regard, a multivariate linear regression computation allows for an accurate estimation of the effective weight values $W_E$ of the given weight matrix W stored in an RPU array, wherein the computation of the effective weight values $W_E$ compensates/corrects the error component b (e.g., linear offset errors) of the RPU hardware and, thus, provides a true measure of the matrix-vector multiplication performance of the RPU hardware. Various methods for extracting weight values of a weight matrix stored in an RPU array will now be discussed in further detail in conjunction with FIGS. 6, 7A, and 7B.

Figure 6:
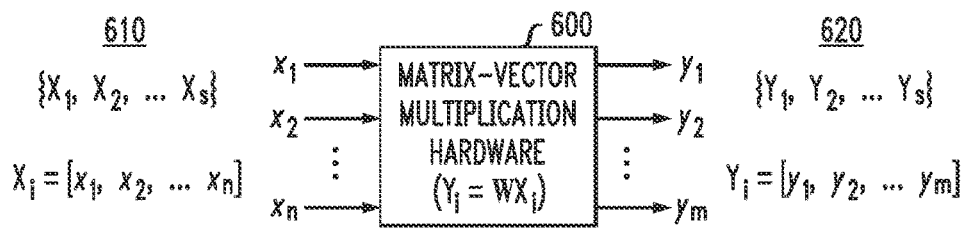
FIG. 6 schematically illustrates a method for extracting weight values of a weight matrix stored in a resistive processing unit array, according to an exemplary embodiment of the disclosure.
Figure 6:
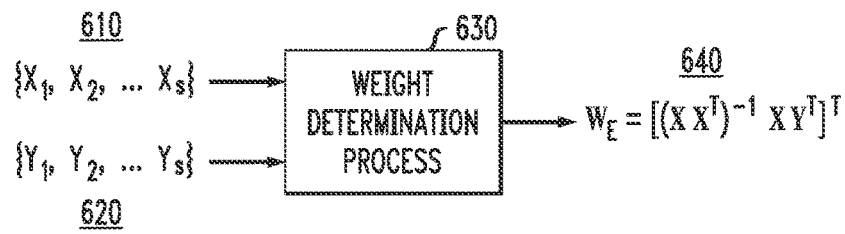

For example, FIG. 6 schematically illustrates method for extracting weight values of a weight matrix stored in an RPU array, according to an exemplary embodiment of the disclosure. More specifically, FIG. 6 schematically illustrates a matrix-vector multiplication hardware block 600, wherein the matrix-vector multiplication hardware block 600 is assumed to be "black box" hardware (e.g., hardware matrix-vector multiplication engine) which is configured to perform matrix-vector multiplication operations. The exemplary weight extraction methods as discussed herein take into consideration a macroscopic functional operation of the "black box" matrix-vector multiplication hardware rather than a microscopic functional architecture/description of such hardware. In this regard, it is to be appreciated that the exemplary weight extraction techniques as disclosed herein are agnostic to the underlying hardware implementation of the matrix-vector multiplication hardware block 600.

As further shown in FIG. 6, the matrix-vector multiplication hardware block 600 sequentially receives as input a plurality (s) of input vectors 610, denoted $\{X_1, X_2, \ldots X_s\}$ or $\{X_i\}_{i=1}^{s}$, wherein each input vector $X_i$ comprises a vector (e.g., n×1 column vector) of n parameters, $X_i=[x_1, x_2, \ldots, x_n]$. The matrix-vector multiplication hardware block 600 is configured to store a weight matrix W (e.g., m×n matrix) and perform a matrix-vector multiplication operation on each input vector $X_i$ to compute a corresponding resulting output vector $Y_i$, wherein $Y_i=WX_i$. In response to the plurality (s) of input vectors 610 $\{X_1, X_2, \ldots X_s\}$, the matrix-vector multiplication hardware block 600 outputs a plurality (s) of corresponding output vectors 620, denoted $\{Y_1, Y_2, \ldots Y_s\}$, wherein each resulting output vector $Y_i$ (e.g., m×1 column vector) comprises a vector of in parameters, $Y_i=[y_1, y_2, \ldots y_m]$.

The matrix-vector multiplication operations result in a set of data pairs, $\{X_i, Y_i\}_{i=1}^{S}$ comprising s pairs of $X_i$, $Y_i$ data (or s observations), which are utilized by a weight determination process 630 to compute a matrix of effective weight values $W_E$ 640 for the m×n weight matrix W stored in the matrix-vector multiplication hardware block 600. In some embodiments, the weight determination process 630 generates (i) a first matrix X of size n×s in which each column of the first matrix X comprises a corresponding one of the input vectors $\{X_i\}_{i=1}^{s}$ and (ii) a second matrix Y of size m×s in which each column of the second matrix X comprises a corresponding one of the resulting output vectors $\{Y_i\}_{i=1}^{s}$.

In some embodiments, the weight determination process 630 computes the effective weight values $W_E$ of a given weight matrix W stored in the matrix-vector multiplication hardware block 600 by performing a multivariate linear regression computation based on the first matrix X and the second matrix Y. In some embodiments, a multivariate linear regression computation is performed using an ordinary least squares (OLS) estimator process which is configured to estimate parameters in a regression model by minimizing the sum of the squared residuals, $_W^{min}\|Y-WX\|^2$.

For example, in some embodiments, when the matrix-vector multiplication hardware block 600 is configured to compute $Y_i=WX_i$, the weight determination process 630 computes the effective weight values of the weight matrix $W_E$ as:

$$W_E=[(XX^T)^{-1}XY^T]^T \qquad \text{Eqn. 1}$$

wherein $W_E$ denotes an OLS estimator, the matrix X comprises a matrix of regressor variables, the matrix Y comprises a matrix of values of a response variable, and wherein T denotes a matrix transpose. In other embodiments, when the matrix-vector multiplication hardware block 600 is configured to compute $Y_i=X_iW$, where W is an m×n matrix, $X_i$ is a 1×m row vector, $Y_i$ is 1×n row vector, X is a s×m matrix, and where Y is a s×n matrix, the weight determination process 630 computes the effective weight values of the weight matrix $W_E$ as:

$$W_E=[(X^TX)^{-1}X^TY] \qquad \text{Eqn. 2.}$$

In the above exemplary illustrations where the weight matrix W is a m×n matrix and the matrix X is a n×s matrix, the computation of the matrix $X X^T$ in Eqn. 1 yields an n×n matrix. In this regard, to properly compute the inverse matrix $(X X^T)^{-1}$, the rank of the matrix $X X^T$ in Eqn. 1 should be equal to n, wherein the rank of a matrix is defined as the maximum number of linearly independent row vectors in the matrix. Similarly, in the above exemplary illustrations where the weight matrix W is a m×n matrix and the matrix X is a s×m matrix, the computation of the matrix $X^TX$ in Eqn. 2 yields an m×m matrix. In this regard, to properly compute the inverse matrix $(X^TX)^{-1}$, the rank of the matrix $X^TX$ in Eqn. 2 should be equal to m.

Another factor that should be considered in Eqns. 1 and 2 for accurately computing $W_E$ is the sensitivity of $W_E$ based on the condition number of the matrix $X X^T$ (Eqn. 1) for inversion, or the condition number of the matrix $X^TX$ (Eqn. 2) for inversion. A condition number for a matrix and computational task measures how sensitive the resulting solution is to perturbations in the input data and to roundoff errors made during the solution process. In some embodiments, it is preferable that the condition number of the matrix $X X^T$ (Eqn. 1) or the matrix $X^TX$ (Eqn. 2), be equal to 1, or as close as possible to 1. Ideally, the matrix $X X^T$ (Eqn. 1) or the matrix $X^TX$ (Eqn. 2) will be an identity matrix I. In this regard, the matrix $X X^T$ (Eqn. 1) or the matrix $X^TX$ (Eqn. 2) should be well-conditioned in order to more accurately compute the inverse matrix $(X X^T)^{-1}$ or the inverse matrix $(X^TX)^{-1}$. In some embodiments, the set of input vectors $X_i$ which make up the matrix X can be selected to achieve a well-conditioned matrix $X X^T$ (Eqn. 1) or $X^T X$ (Eqn. 2) for inversion.

Figure 7A:
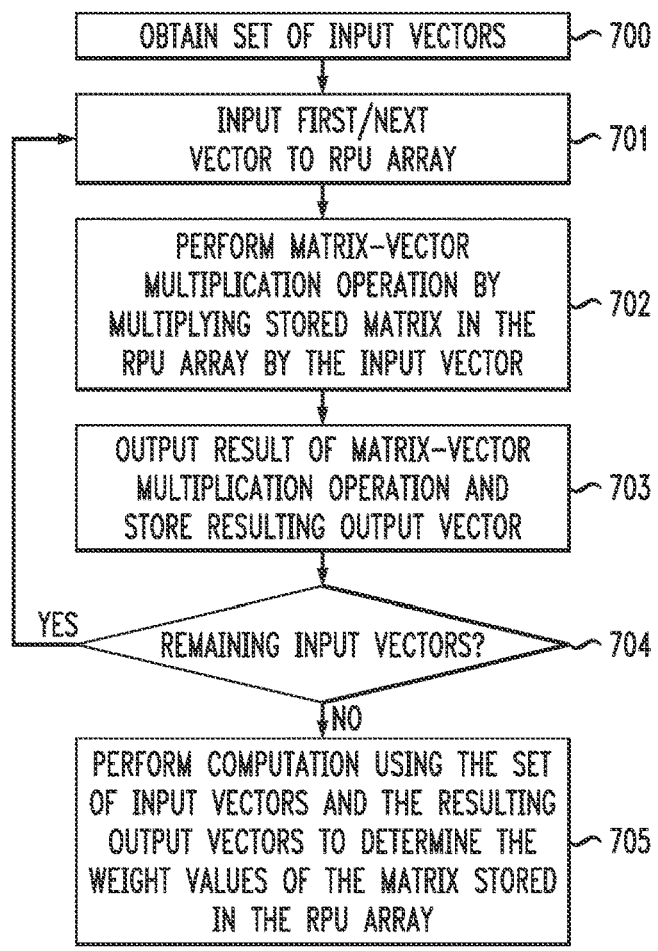
FIG. 7A illustrates a flow diagram of a method for extracting weight values of a weight matrix stored in a resistive processing unit array, according to an exemplary embodiment of the disclosure.

FIG. 7A illustrates a flow diagram of a method for extracting weight values of a weight matrix stored in an RPU array, according to an exemplary embodiment of the disclosure. In some embodiments, FIG. 7A illustrates an exemplary mode of operation of the weight extraction process 132 of FIG. 1. In some embodiments, FIG. 7A illustrates a process flow of the weight extraction process schematically illustrated in FIG. 6. In this regard, for purposes of illustration, the process flow of FIG. 7A will be discussed in the context of FIGS. 1 and 6. The process of FIG. 7A assumes that a given weight matrix W is stored in a given RPU array (e.g., RPU tile), wherein the weight extraction process 132 is performed to determine the effective weight values $W_E$ of the weight matrix W stored in the given RPU array (e.g., RPU tile) by correcting for the linear error components b (e.g., hardware offsets) of the RPU hardware.

As an initial step, the weight extraction process 132 obtains a set of input vectors $X_i$ comprising s input vectors, $\{X_i\}_{i=1}^s$. In some embodiments, the set of input vectors $\{X_i\}_{i=1}^s$ comprises a set of random vectors which are configured to provide a high entropy input. For example, in some embodiments, the set of input vectors comprises a set of linearly independent vectors. The vectors in a given set of input vectors are deemed to be linearly independent vectors if no vector in the given set of input vectors is a linear combination of other vectors in the set of input vectors. By way of example, in some embodiments, the set of input vectors can be obtained from rows of a Hadamard matrix, which is a square matrix having entries of either +1 or −1, wherein the rows of the Hadamard matrix are mutually orthogonal (i.e., all rows are orthogonal to each other and are therefore linearly independent). In some embodiments, the number s of input vectors that are utilized for the weight extraction process will vary depending on, e.g., the size of the stored weight matrix W and the associated effective weight matrix $W_E$. For example, assuming that the weight matrix W and the associated effective weight matrix $W_E$ have a matrix size of m×n, the number of input vectors s can be on the order of 10×n or greater, or 10×m or greater.

The weight extraction process 132 sequentially inputs each input vector $X_i$ to the RPU system (block 701) to perform a matrix-vector multiplication by multiplying the weight matrix W stored in the RPU array by each input vector $X_i$ (block 702). Each matrix-vector multiplication operation generates a resulting output vector $Y_i$, wherein the resulting output vector $Y_i$ is output from the RPU system and stored by the weight extraction process 132 (block 703). The process (blocks 701, 702, and 703) is repeated for all input vectors in the obtained set of input vectors. When there are no remaining input vectors to process (negative result in block 704), the weight extraction process 132 proceeds to perform a computation (e.g., weight determination process 630, FIG. 6) to determine the effective weight values $W_E$ of the weight matrix W stored in the given RPU array (block 705). As noted above, in some embodiments, the effective weight values of the weight matrix $W_E$ are computed using Eqn. 1 or Eqn. 2.

In some embodiments, the inverse matrices $(X X^T)^{-1}$ and $(X^T X)^{-1}$ can be computed in the digital domain using any suitable matrix inversion process to compute an estimate of the inverse matrix. For example, in some embodiments, the matrix inversion process is implemented using a Neuman series process and/or a Newton iteration process to compute an approximation of the inverse matrix $(X X^T)^{-1}$ or $(X^T X)^{-1}$, which exemplary methods are known to those of ordinary skill in the art. In some embodiments, the matrix inversion process is performed using the hardware acceleration computing techniques as disclosed in U.S. patent application Ser. No. 17/134,814, filed on Dec. 28, 2020, entitled: Matrix Inversion Using Analog Resistive Crossbar Array hardware, which is commonly assigned and fully incorporated herein by reference. U.S. patent application Ser. No. 17/134,814 discloses techniques to perform a matrix inversion process which comprises, e.g., (i) storing a first estimated inverse matrix of the given matrix A (wherein A is $X X^T$ (Eqn. 1) or $X^T X$ (Eqn. 2)) in one or more of the RPU array(s), and (ii) performing a first iterative process on the first estimated inverse matrix stored in the array of RPU cells to converge the first estimated inverse matrix to a second estimated inverse matrix of the given matrix. In some embodiments, the first iterative process comprises a stochastic gradient descent optimization process which comprises utilizing row vectors of the given matrix A as training data to train the first estimated inverse matrix stored in the array of RPU cells and update matrix values of the first estimated inverse matrix stored in the array of RPU cells by utilizing error vectors that are determined based on matrix values of an identity matrix. Further details of the matrix inversion process flow are described in the U.S. patent application Ser. No. 17/134,814, which is incorporated herein by reference.

The computed weight matrix $W_E$ can be utilized in various manners to determine the performance of the given matrix-vector hardware (e.g., RPU hardware). For example, in some embodiments, a "static test" can be performed by comparing the computed weight matrix $W_E$ with a corresponding target weight matrix $W_T$ (e.g., software matrix) that is written into a given RPU array (or RPU tile) to determine the difference between the computed weight matrix $W_E$ and the corresponding target weight matrix $W_T$. The determined difference between $W_E$ and $W_T$ can be analyzed to estimate or otherwise quantify write noise (e.g., read-write-verify programming). In other embodiments, the matrices $W_E$ and $W_T$ can be utilized by the weight tuning and programming process 134 (FIG. 1) to fine-tune programmed weight values $W_P$ which are stored in an RPU, where $W_P$ corresponds to $W_T$, the details of which will be explained in further detail below in conjunction with FIGS. 8 and 9.

Furthermore, in some embodiments, an effective matrix $W_E$ can be computed multiple times for a given weight matrix W that is stored in a given RPU array to estimate or otherwise quantify other errors such as hardware drift and the error components f(x) and noise, as noted above. For example, in an exemplary embodiment, an effective weight matrix $W_E$ can be computed several times for a given weight matrix W that is stored in a given RPU array of given RPU hardware. The different effective weight matrices $W_E$ that are computed can compared to determine the differences between the effective weight matrices $W_E$, wherein such differences can be analyzed to estimate or otherwise quantify the noise error component associated with the given RPU hardware. More specifically, in some embodiments, two or more weight matrices $W_E$ can be computed (in the same hour or day) for a stored weight matrix W using the same set of input vectors or different sets of input vectors for the weight extraction operations. The two or more effective weight matrices $W_E$ are then compared to determine the differences between the two or more effective weight matrices $W_E$, and such differences are analyzed to estimate or otherwise quantify the noise error component associated with the given RPU hardware.

In other embodiments, two or more effective weight matrices $W_E$ can be computed, on the same day, for a given a given weight matrix W that is stored in a given RPU array of given RPU hardware, followed by computing one or more additional effective weight matrices $W_E$ over, e.g., the next day or week, using the same set of input vectors or different sets of input vectors for the weight extraction computations. The various effective weight matrices $W_E$, which are computed over several days or weeks, are compared to determine the differences between such effective weight matrices $W_E$. Such differences can be analyzed to estimate or otherwise quantify hardware drift of the RPU hardware (e.g., drift in PCM devices). In other embodiments, the differences between the effective weight matrices $W_E$, which are computed over several days or weeks, can be analyzed to estimate or otherwise quantify the non-linear response of the RPU hardware (e.g., the error components f(x), as noted above).

Figure 7B:
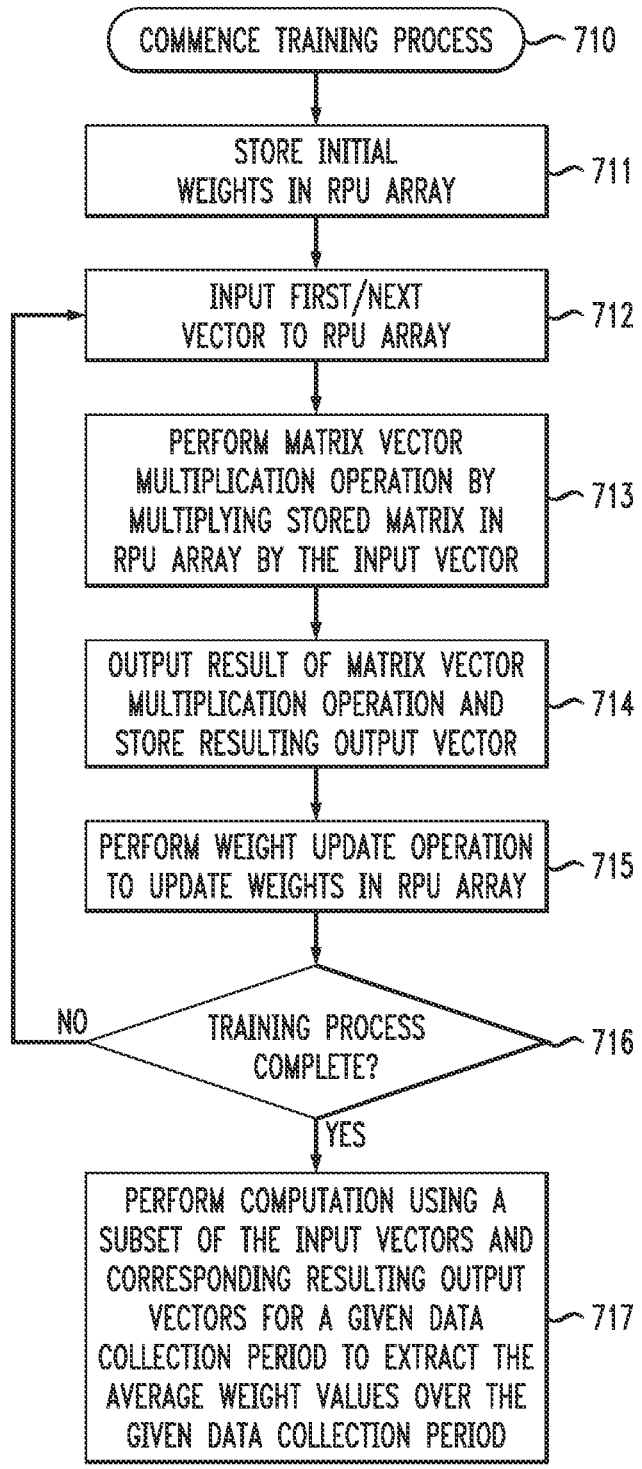
FIG. 7B illustrates a flow diagram of a method for extracting weight values of a weight matrix stored in a resistive processing unit array, according to another exemplary embodiment of the disclosure.

FIG. 7B illustrates a flow diagram of a method for extracting weight values of a weight matrix stored in an RPU array, according to another exemplary embodiment of the disclosure. In some embodiments, FIG. 7B illustrates an exemplary mode of operation of the computing system 100 of FIG. 1 performing a process 130 which implements the weight extraction process 132 (FIG. 1) in conjunction with a model training process (e.g., FIGS. 3A, 3B, and 3C) to train, e.g., one or more arrays of synaptic weights in RPU arrays for a given artificial neural network (e.g., CNN, DNN, etc.). In this regard, for illustrative purposes, the process flow of FIG. 7B will be discussed in the context of the computing system 100 of FIG. 1.

The computing system 100 invokes and commences training process (block 710). In some embodiments, the invocation of the training process comprises an initial process of configuring the neuromorphic computing system 120 (e.g., RPU system) to perform hardware accelerated computation operations that will be needed to perform a model training process (e.g., the backpropagation process of FIGS. 3A, 3B, and 3C). For example, in some embodiments, the digital signal processing system 110 communicates with a programming interface of the neuromorphic computing system 120 to configure one or more artificial neurons and a routing system of the neuromorphic computing system 120 to allocate and configure one or more neural cores to (i) implement one or more interconnected RPU arrays for storing initial weight matrices and to (ii) perform in-memory computations (e.g., matrix-vector computations, outer product computations, etc.) needed to implement the training process and weight extraction process.

In some embodiments, the number of RPU arrays that are allocated and interconnected to configure the artificial synapses of the artificial neural network will vary depending on the number and sizes of the synaptic weight matrices that are needed for training the artificial neural network, as well as the size of the RPU arrays. For example, if each RPU array has a size of 4096×4096, then one RPU array can be configured to store the values of a given m×n weight matrix W, where m and n are 4096 or less. In some embodiments, when the given m×n weight matrix W is smaller than the physical RPU on which the given m×n weight matrix W is stored, any unused RPU cells can be set to zero and/or unused inputs to the RPU array can be padded by "zero" voltages. In some embodiments, when the size of the given m×n weight matrix W is greater than the size of a single RPU array, then multiple RPU arrays can be operatively interconnected to form an RPU array which is large enough to store the values of the given m×n weight matrix W.

Once the RPU system is configured for the training process, the initial weight values of the artificial synapses are stored in the RPU arrays (block 711). For purposes of illustration, the process flow of FIG. 7B will be discussed in the context of operations that are performed on a given synaptic weight matrix which is stored in a given RPU array (or RPU tile) and which provides weighted connections between artificial neurons (e.g., pre-synaptic neurons and post-synaptic neurons) of two different layers of the artificial neural network (e.g., input layer and first hidden layer). It is to be understood that the same process flow would be applied for all synaptic weight matrices disposed between all artificial neuron layers (e.g., input layer, hidden intermediate layer(s), output layer) of the artificial neural network.

As an initial phase of the training process, the computing system 100 would obtain a set of training data, such as a MNIST (Modified National Institute of Standards and Technology) dataset, for use in training the artificial neural network. The set of training data would be converted to a set of input vectors that would be applied to the input layer of the artificial neural network. As part of the training process, an input vector would be applied to the input layer of the neural network and then propagated through the neural network as part of a forward pass iteration. In this process, the input vectors to a given synaptic weight matrix in the RPU array would represent the input activity of the specific layer connected to the input of the synaptic weight matrix.

During a given forward pass iteration of the training process, the input vector from a given layer (e.g., input layer) would be input the RPU array which stores the given synaptic weight matrix connected to the given layer (block 712), and a matrix-vector multiplication is performed multiplying the synaptic weight matrix W stored in the given RPU array by the input vector (block 713). Each matrix-vector multiplication operation generates a resulting output vector which is input to a next layer of the artificial neural network, wherein the resulting output vector $Y_i$ is stored for subsequent use by the weight extraction process 132 (block 714). As noted above, following a given iteration of the forward pass cycle, a backward pass cycle is performed to propagate the resulting errors back through the artificial neural network from the output layer to the input layer. Following the backward pass iteration for a given weight matrix in a given RPU array, a weight update operation is performed to update the synaptic weight values of the given weight matrix in the given RPU array (block 715).

The iterative training process (blocks 712, 713, 714, and 715) is repeated for remaining input vectors associated with the obtained training dataset, until a convergence criterion is met, indicating completion of the training process (block 716). When the training process is complete (affirmative determination in block 716), a weight extraction process (e.g., process 132, FIG. 1) is commenced to compute a matrix of effective synaptic weight values $W_E$ of the trained synaptic weight matrix W stored in the given RPU array using a set of input vectors and corresponding output vectors which are collected for given data collection period during the training process (block 717). The effective synaptic weight values $W_E$ of the trained synaptic weight matrix in the given RPU array are computed using Eqn. 1 or Eqn. 2, as discussed above.

In some embodiments, the weight extraction process 132 will utilize a portion of the input/output vector pairs for the given RPU array, which were generated during the training process. More specifically, while a given training process may involve millions of iterations of the forward pass operation, thereby generating millions of input/output vector pairs for the given RPU array, the weight extraction process 132 will utilize a portion of the input/output vector pairs which are collected for the given RPU array during the training process. For example, in some embodiments, the weight extraction process 132 can utilize the last 100K of input/output vector pairs generated by the given RPU array (via matrix-vector multiplication operations) as a result of the last 100K forward pass iterations of the training process, which are performed prior to completion of the training process.

With this process, the effective synaptic weight values $W_E$, which are computed using Eqn. 1 or 2, represent an average or time average of the trained synaptic weight values of the trained weight matrix in the given RPU array over the duration of the data collection period associated with the portion of input/output vectors used to compute $W_E$. More specifically, during the training process, the synaptic weight values of the synaptic weight matrix stored in the given RPU array evolve over time (via the update process). In this regard, when a set of input/output vector pairs, which are collected over a given data collection period of the training process, are used to compute the effective synaptic weight values $W_E$, the values of $W_E$ will represent the time average of the effective synaptic weight values of the trained synaptic weight matrix over the given data collection period.

It is to be understood that the process flow of FIG. 7B is agnostic to the specify training process that is implemented. In this regard, irrespective of the specific implementation of the training process, the weight extraction process 132 will collect pairs of input/output vectors that are generated during the training process for a given RPU array which stores a learned weight matrix, and utilize the collected pairs of input/output vectors to compute $W_E$ for the learned weight matrix stored in the given RPU array. In other embodiments, instead of the utilizing the collected pairs of input/output vectors which are generated for a given RPU array during the training process, the effective weight values of a trained weight matrix in the given RPU array can be computed using, e.g., the process flow of FIG. 7A. In this instance, following completion of the neural network training process, the trained weight matrices stored in each of the RPU arrays for the given artificial neural network can be extracted using the process flow of FIG. 7A. More specifically, for this process, as discussed above, a set of random input vectors are obtained an applied to a given RPU array to compute a set of corresponding output vectors resulting from the multiplication of the random input vectors by the trained synaptic weight matrix stored in the given RPU array. The set of random input vectors and the corresponding set of resulting output vectors for a given RPU array are then used to compute the effective weight values $W_E$ of the trained weight matrix stored in the given RPU array. In other embodiments, the input vectors that are used for the process of FIG. 7A can be obtained from a portion of the input vectors that are generated from the training dataset.

In other embodiments of the disclosure, a weight extraction process is utilized in conjunction with a weight tuning and programming process to program weights of a given weight matrix stored in a given RPU array. As noted above, the effective weight matrix $W_E$, which is computed for a given weight matrix W stored in given RPU array (or RPU tile), provides a mechanism to characterize the effective behavior of the RPU hardware. For example, the actual programmed weight values $W_P$ of a given weight matrix W stored in the RPU array can vary from the corresponding computed effective weight values $W_E$ of the given weight matrix W stored in the RPU array due to, error components, write noise, etc.

In some embodiments, a weight tuning and programming process (e.g., process 134, FIG. 1) is configured to tune the programmed weight values $W_P$ of a given weight matrix W stored in a given RPU array such that the effective weight matrix values $W_E$ are substantially equal to target weight values $W_T$. With such process, an RPU array can be programmed to store a weight matrix having programmed weight values $W_P$ such that $W_P$ is as close as possible to $W_T$. The effective matrix-vector multiplication behavior of the RPU hardware can be characterized based on $W_E$, wherein such characterization is then utilized to fine tune/update programmed weight values $W_P$ such that $W_P$ is as close as possible to $W_T$. An exemplary weight tuning and programming process will now be described in further detail in conjunction with FIGS. 8 and 9. In some embodiments, FIGS. 8 and 9 illustrate modes of operation of the computing system 100 of FIG. 1 when performing the process 130 using constituent weight extraction process 132 and weight tuning and programming process 134, according to an exemplary embodiment of the disclosure.

Figure 8:
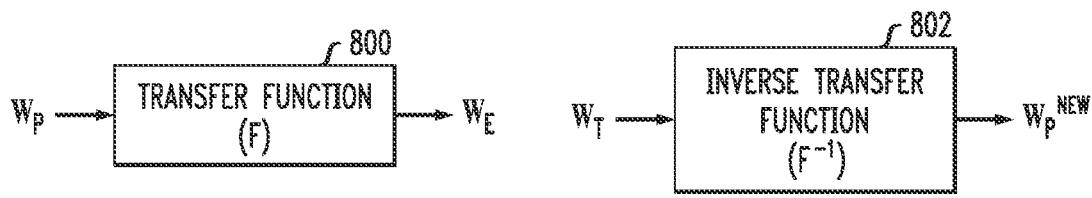
FIG. 8 schematically illustrates method for programming and tuning weight values of a weight matrix stored in resistive processing unit array, according to an exemplary embodiment of the disclosure.

For example, FIG. 8 schematically illustrates method for programming and tuning weight values of a weight matrix stored in an RPU array, according to an exemplary embodiment of the disclosure. More specifically, FIG. 8 schematically illustrates a transfer function (F) block 800, and an inverse transfer function (F−1) block 802. In some embodiments, transfer function (F) block 800, and the inverse transfer function (F−1) block 802 are processing modules that are implemented by the weight tuning and programming process 134 of the computing system 100 of FIG. 1. The transfer function block 800 implements methods that are configured to determine a transfer function F which represents a relationship between programmed weight values $W_P$ and corresponding effective weight values $W_E$, wherein $W_E$ correspond to the extracted weight values that are computed by performing a weight extraction process with $W_P$ stored in a given RPU array. The inverse transfer function block 802 implements methods that are configured to apply target weight values $W_T$ to the inverse transfer function $F^{-1}$ to compute new programmed weight values $W_P^{New}$. The programmed weight values $W_P$ stored in the given RPU array are updated using the new programmed weight values $W_P^{New}$. The exemplary weight programming and tuning process provides a mechanism to compensate for non-linear error components f(x) associated with the RPU hardware.

Figure 9:
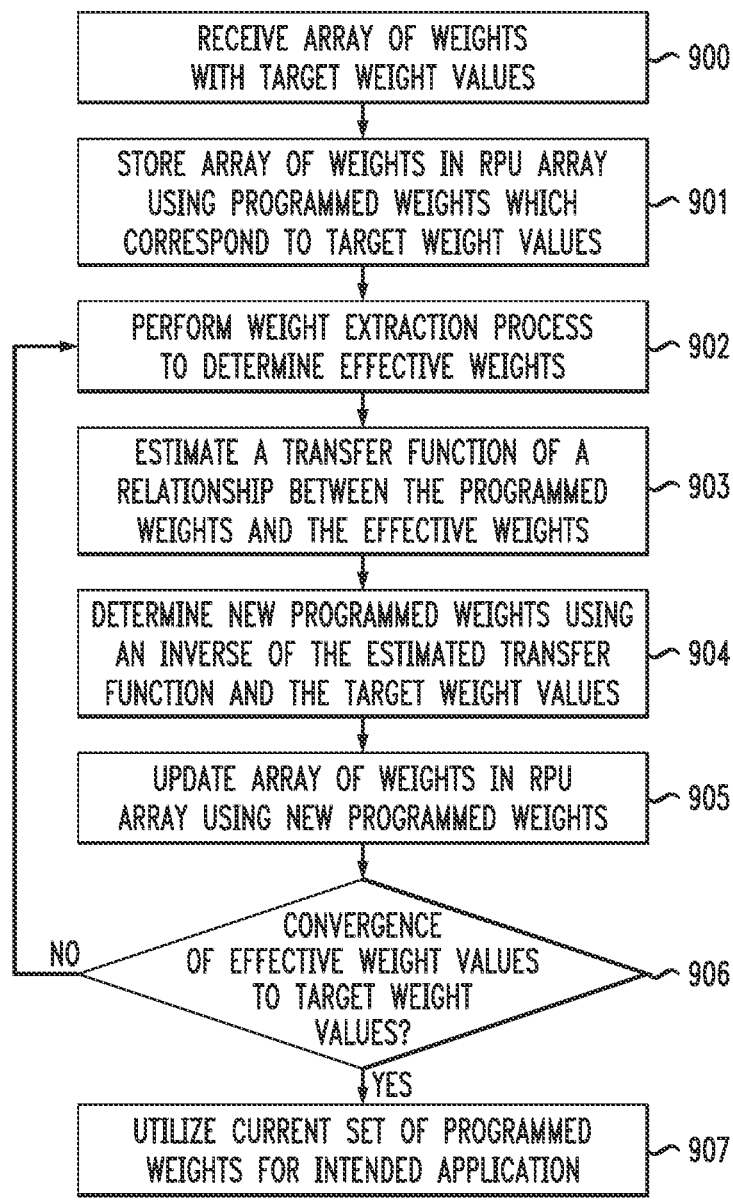
FIG. 9 illustrates a flow diagram of a method for programming and tuning weight values of a weight matrix stored in resistive processing unit array, according to an exemplary embodiment of the disclosure.

FIG. 9 illustrates a flow diagram of a method for programming and tuning weight values of a weight matrix stored in an RPU array, according to an exemplary embodiment of the disclosure. In some embodiments, the process flow of FIG. 9 illustrates exemplary operating modes of the weight extraction process 132 and the weight tuning and programming process 134 (FIG. 1), wherein it is assumed that the functions of the transfer function (F) block 800, and the inverse transfer function (F−1) block 802 of FIG. 8 are performed as part of the weight tuning and programming process 134. In this regard, for illustrative purposes, the process flow of FIG. 9 will be discussed in the context of FIG. 8 and the computing system 100 of FIG. 1.

Referring to FIG. 9, an initial step includes the weight tuning and programming process 134 receiving an array of weight with target weight values $W_T$ (block 900). The weight tuning and programming process 134 determines initial programmed weight values $W_P$ which correspond to the target weight values $W_T$ and then stores the initial programmed weight values $W_P$ in a weight matrix in a given RPU array of a neural core 122 of the neuromorphic computing system 120 (block 901). With this process, the programmed weight values $W_P$ are determined to be as accurate as possible to the corresponding target weight values $W_T$. After storing the initial programmed weight values $W_P$ in the given RPU array, the weight extraction process 132 is invoked to determine a matrix of effective weight values $W_E$ for the matrix of programmed weight values $W_P$ stored in the given RPU array (block 902). In some embodiments, the weight extraction process is performed using the techniques discussed above in conjunction with FIGS. 6 and 7A.

The weight tuning and programming process 134 receives $W_E$ and proceeds to determine a transfer function F which defines a relationship between the current programmed weight values $W_P$ and the corresponding effective weight values $W_E$ (block 903). More specifically, the transfer function is configured to model a relationship between the target behavior and the effective behavior of the RPU hardware with respect to the matrix-vector multiplication operations of the RPU hardware. In some embodiments, the transfer function F can be estimated using linear approximation techniques in instances where there are relatively small differences between the programmed weight values $W_P$ and the corresponding effective weight values $W_E$. For example, in some embodiments, the transfer function F can be estimated using a first order linear approximation based on a partial derivative of $W_E$ with respect to $W_P$, i.e., $$\frac{\partial W_E}{\partial W_P},$$

which represents a sensitivity of the effective weight values $W_E$ with respect to the programmed weight values $W_P$.

In some embodiments, the transfer function F comprises a matrix of scalar values, wherein when the programmed weight values $W_P$ are multiplied by the transfer function (via element-wise multiplication of the matrix of scalar values), the corresponding effective weight values $W_E$ are obtained. By way of a simple illustration, assume a given programmed weight value (in the matrix $W_P$) has a value of "10", and the corresponding effective weight value (in the computed matrix $W_E$) has a value of "20", and the corresponding target weight value (in the matrix $W_T$) has a value of "15." In this example, the $W_P$ value 10 is twice the $W_E$ value of 20, so a new $W_P$ value 7.5 (which is less than the original value of 10) can be applied (7.5=15/2) to converge the effective behavior more closely to the target behavior. In this process, the effective weight values $W_E$ can be compared to the corresponding target weight values $W_T$ to determine the differences between such corresponding values (magnitude and sign) and then utilize such difference information to adjust (e.g., increase or decrease) the corresponding programmed weight values $W_P$ accordingly. It is to be understood that any suitable technique can be implemented to estimate a transfer function for the given application.

After the transfer function is estimated, new/updated programmed weight values $W_P^{New}$ are determined using an inverse $F^{-1}$ of the estimated transfer function F and the target weight values $W_T$ (block 904). More specifically, in some embodiments, as shown in FIG. 8, the new programmed weight values $W_P^{New}$ are determined by applying the target weight values $W_T$ to the inverse transfer function $F^{-1}$. In some embodiments, the inverse transfer function $F^{-1}$ comprises a scalar matrix of reciprocals of the scalar values of the estimated transfer function F, wherein the new programmed weight values $W_P^{New}$ are computed by multiplying the target weight values $W_T$ by the corresponding scalar reciprocal values of the inverse transfer function (via element-wise multiplication). The weight values of the weight matrix stored in the RPU array are then updated using the new/updated programmed weight values $W_P^{New}$ (block 905).

A determination is then made as to whether the currently computed effective weight values $W_E$ have converged to the corresponding target weight values $W_T$ (determination block 906). In some embodiments, convergence is determined by computing a difference (error, err) between each corresponding weight value of $W_E$ and $W_T$ and comparing each computed difference (err) to an error threshold value $\epsilon$ (or accuracy threshold) to determine whether or not the difference (err) exceeds the error threshold value $\epsilon$, e.g., to determine if err$\leq \epsilon$. In some embodiments, the error threshold value $\epsilon$ is set to a value on the order of $1 \times 10^{-4}$ or smaller. The error threshold value E can be selected to be any desired value depending on the application.

If it is determined that the currently computed effective weight values $W_E$ have not converged to the corresponding target weight values $W_T$ (negative determination in block 906), another iteration of the process (blocks 902, 903, 904, and 905) can be performed to converge $W_E$ closer to $W_T$. In some embodiments, a state of convergence is determined when the computed difference (err) between each corresponding weight value of $W_E$ and $W_T$ does not exceed the error threshold value $\epsilon$.

On the other hand, if it is determined that the currently computed effective weight values $W_E$ have converged to the corresponding target weight values $W_T$ (affirmative determination in block 906), the current set of programmed weight values $W_P$ can be utilized for a given application (block 907). For example, the programmed weight values $W_P$ can be utilized for inference processing. At the completion of the weight programming and tuning process, the programmed weight values $W_P$ of the stored weight matrix in the given RPU result in the effective behavior of the RPU hardware being closely matched to the target behavior of the RPU hardware with respect to, e.g., matrix-vector multiplication operations performed by the RPU hardware on the stored weight matrix $W_P$ in the given RPU array. The exemplary weight programming and tuning process of FIG. 9 provides a mechanism to compensate for non-linear error components f(x) associated with the RPU hardware.

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
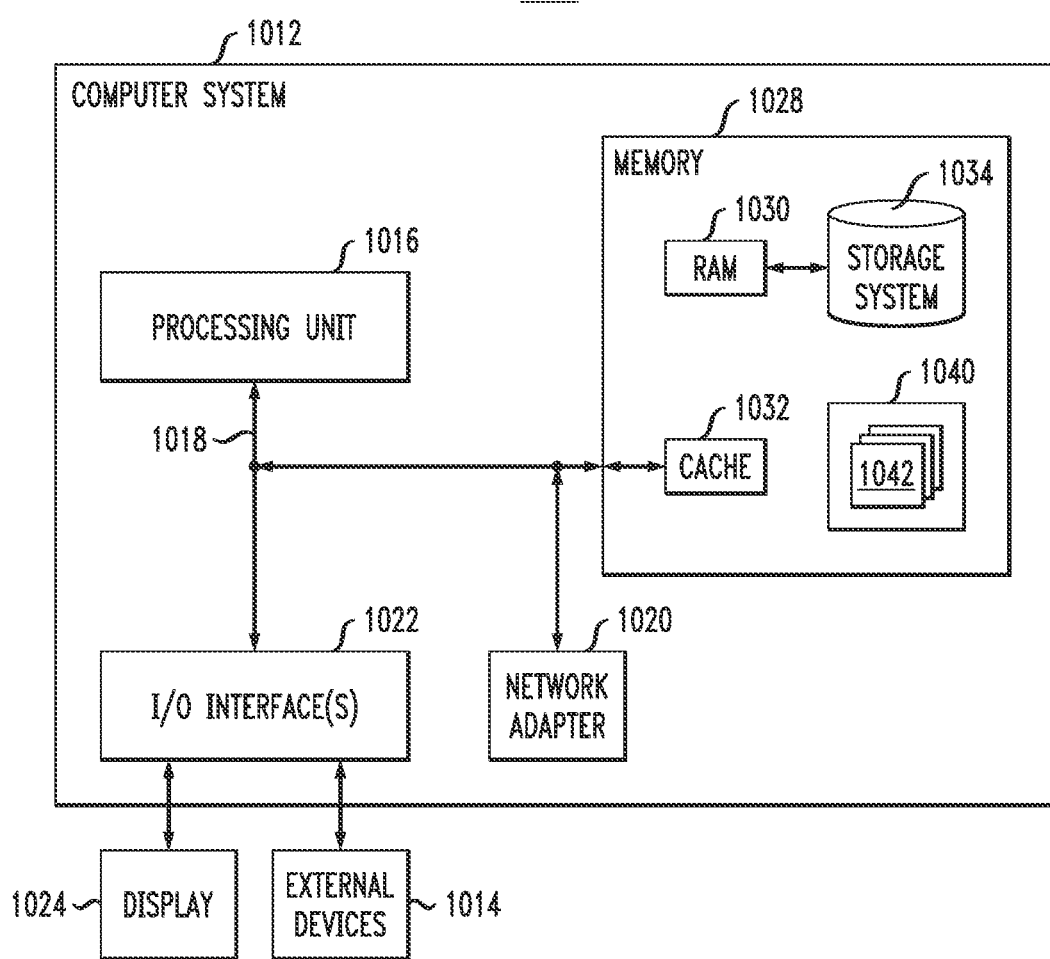
FIG. 10 schematically illustrates an exemplary architecture of a computing node which can host the computing system of FIG. 1, according to an exemplary embodiment of the disclosure.

These concepts are illustrated with reference to FIG. 10, which schematically illustrates an exemplary architecture of a computing node that can host the computing system of FIG. 1, according to an exemplary embodiment of the disclosure. FIG. 10 illustrates a computing node 1000 which comprises a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 1012 in computing node 1000 is shown in the form of a general-purpose computing device. The components of computer system/server 1012 may include, but are not limited to, one or more processors or processing units 1016, a system memory 1028, and a bus 1018 that couples various system components including system memory 1028 to the processors 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random-access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As depicted and described herein, memory 1028 may include at least one program product having a set (e.g., at least one) of program modules that are configured to carry out the functions of embodiments of the invention.

The program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the disclosure as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via Input/Output (I/O) interfaces 1022. Still yet, computer system/server 1012 can communicate with one or more networks such as a local area network (LAN), a general wide area network (WAN), and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
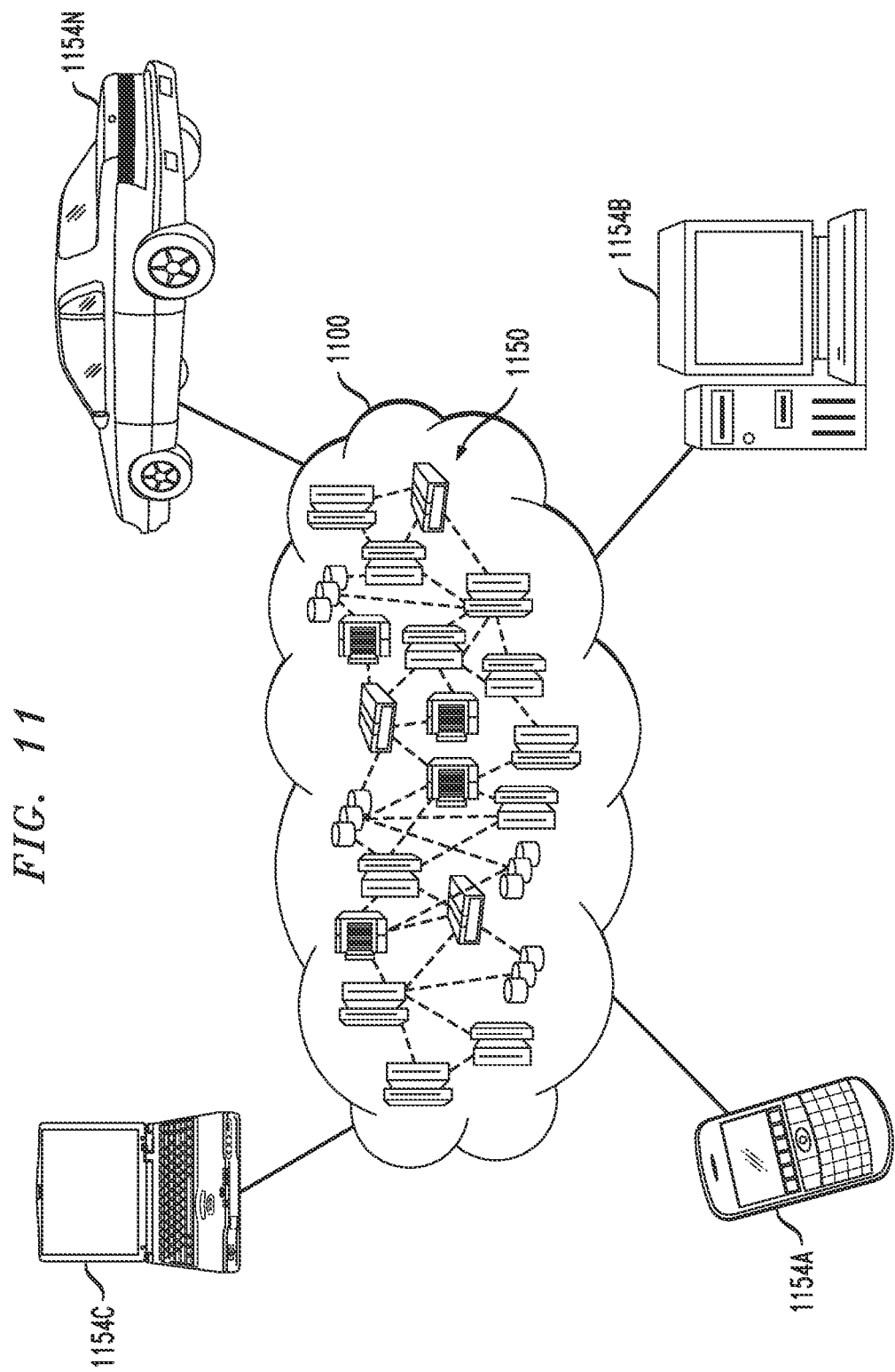
FIG. 11 depicts a cloud computing environment according to an exemplary embodiment of the disclosure.

Referring now to FIG. 11, illustrative cloud computing environment 1100 is depicted. As shown, cloud computing environment 1100 includes one or more cloud computing nodes 1150 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1150 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1150 and cloud computing environment 1100 can communicate with any type of computerized device over any type of network and/or network addressable connection (e.g., using a web browser).

Figure 12:
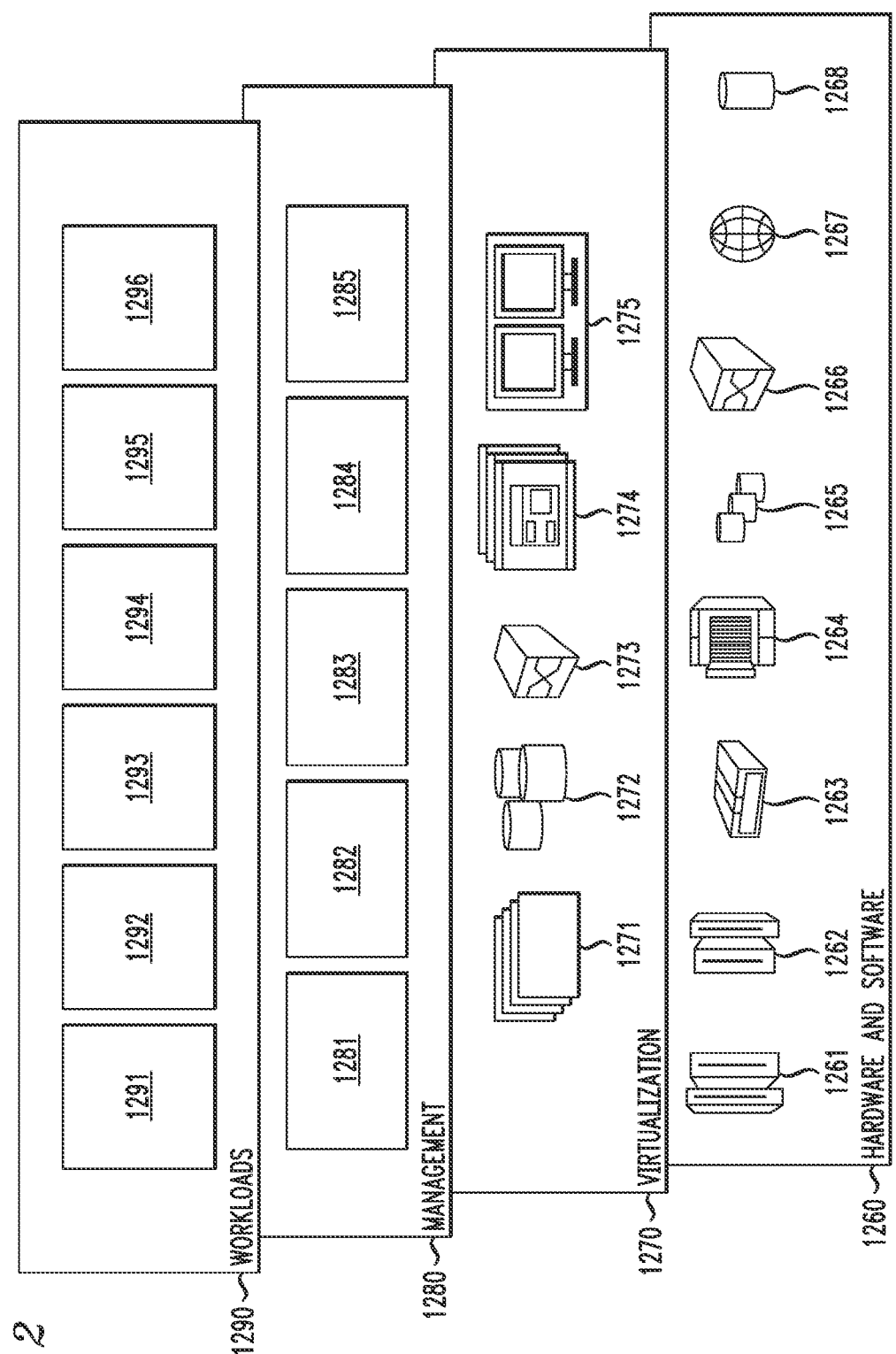
FIG. 12 depicts abstraction model layers according to an exemplary embodiment of the disclosure.

Referring now to FIG. 12, a set of functional abstraction layers provided by cloud computing environment 1100 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and various functions 1296 for performing hardware accelerated computing and analog in-memory computations using an RPU system with RPU arrays, wherein such computation included, but are not limited to, weight extraction operations, weight programming and tuning operations, matrix-vector multiplication operations, vector-vector outer product operations, neural network training operations, etc., based on the exemplary methods and functions discussed above in conjunction with, e.g., FIGS. 3A, 3B, 3C, 6, 7A, 7B, 8, and 9. Furthermore, in some embodiments, the hardware and software layer 1260 would include, e.g., the computing system 100 of FIG. 1 to implement or otherwise support the various workloads and functions 1096 for performing such hardware accelerated computing and analog in-memory computations.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a processor; and
   a resistive processing unit coupled to the processor, the resistive processing unit comprising an array of cells, the cells respectively comprising resistive devices, at least a portion of the resistive devices being programmable to store weight values of a given matrix in the array of cells;
   wherein, when the given matrix is stored in the array of cells, the processor is configured to perform a weight extraction process which comprises applying a set of input vectors to the resistive processing unit to perform analog matrix-vector multiplication operations on the given matrix, obtaining a set of output vectors resulting from the analog matrix-vector multiplication operations, and determining weight values of the given matrix stored in the array of cells utilizing the set of input vectors and the set of output vectors, the determining comprising:
   generating a first matrix comprising the set of input vectors;
   generating a second matrix comprising the set of output vectors; and
   multiplying the first matrix by a transpose of the first matrix to thereby generate a third matrix.

2. The system of claim 1, wherein in performing the weight extraction process, the processor is further configured to apply a set of linearly independent input vectors to the resistive processing unit.

3. The system of claim 1, wherein:
   the processor is configured to perform a model training process which comprises applying a set of training vectors to the resistive processing unit to perform analog matrix-vector multiplication operations on the given matrix during the model training process to thereby generate a trained model which comprises the stored weight values of the given matrix in the array of cells; and
   in performing the weight extraction process, the processor is configured to determine the weight values of the given matrix stored in the array of cells utilizing the set of training vectors and a set of resulting vectors that are generated as a result of the analog matrix-vector multiplication operations performed during the model training process.

4. The system of claim 1, wherein in determining the weight values of the given matrix stored in the array of cells, the processor is configured to perform a multivariate linear regression computation using the set of input vectors and the resulting set of output vectors to determine the weight values of the given matrix stored in the array of cells.

5. The system of claim 1, wherein in determining the weight values of the given matrix stored in the array of cells, the processor is further configured to:
   determine an inverse of the third matrix; and
   multiply the inverse of the third matrix, the first matrix, and a transpose of the second matrix to thereby generate a fourth matrix;
   wherein a transpose of the fourth matrix comprises the determined weight values of the given matrix stored in the array of cells.

6. The system of claim 1, wherein the processor is further configured to:
   compare the determined weight values with corresponding target weights of the given matrix stored in the array of cells to determine differences between the determined weight values and the corresponding target weight values; and
   quantify one of a non-linear response and write noise associated with hardware elements of the resistive processing unit, based on the determined differences between the determined weight values and the corresponding target weight values.

7. The system of claim 1, wherein the processor is further configured to:
   perform a second weight extraction process to determine second weight values of the given matrix stored in the array of cells;
   compare the determined weight values of the given matrix stored in the array of cells with corresponding ones of the second determined weight values of the given matrix stored in the array of cells to determine differences between the determined weight values and the corresponding second determined weight values; and
   quantify one of a non-linear response and write noise associated with hardware elements of the resistive processing unit, based on the determined differences between the determined weight values and the corresponding second determined weight values.

8. The system of claim 1, wherein the processor is further configured to:
   receive an array of weights with target weight values;
   store the array of weights in the array of cells of the resistive processing unit using programmed weight values which correspond to the target weight values;
   estimate a transfer function which represents a relationship between the programmed weight values and the corresponding determined weight values obtained as a result of performing the weight extraction process; and
   apply the target weight values to an inverse of the transfer function to thereby determine a new set of programmed weights.

9. The system of claim 8, wherein the processor is further configured to:
   determine whether the determined weight values have converged to the target weight values within a predetermined accuracy threshold value; and
   update the array of weights stored in the array of cells of the resistive processing unit using the new set of programmed weight, in response to determining that the determined weight values have not converged to the target weight values within the predetermined accuracy threshold value.

10. A computer program product, comprising:
    one or more computer readable storage media, and program instructions collectively stored on the one or more computer readable storage media, the program instructions comprising:
    program instructions to store a given matrix of weight values in an array of cells of a resistive processing unit; and
    program instructions to perform a weight extraction process which comprise:

program instructions to apply a set of input vectors to the resistive processing unit to perform analog matrix-vector multiplication operations on the given matrix;

program instructions to obtain a set of output vectors resulting from the analog matrix-vector multiplication operations; and program instructions to determine weight values of the given matrix stored in the array of cells utilizing the set of input vectors and the set of output vectors, the determining comprising:

generating a first matrix comprising the set of input vectors;

generating a second matrix comprising the set of output vectors; and multiplying the first matrix by a transpose of the first matrix to thereby generate a third matrix.

11. The computer program product of claim 10, wherein the program instructions to apply the set of input vectors to the resistive processing unit to perform the analog matrix-vector multiplication operations comprise program instructions to apply a set of linearly independent input vectors to the resistive processing unit.

12. The computer program product of claim 10, further comprising:

program instructions to perform a model training process which comprises applying a set of training vectors to the resistive processing unit to perform analog matrix-vector multiplication operations on the given matrix during the model training process to thereby generate a trained model which comprises the stored weight values of the given matrix in the array of cells; and wherein the program instructions to perform the weight extraction process comprise program instructions to determine the weight values of the given matrix stored in the array of cells utilizing the set of training vectors and a set of resulting vectors that are generated as a result of the analog matrix-vector multiplication operations performed during the model training process.

13. The computer program product of claim 10, wherein the program instructions to determine the weight values of the given matrix stored in the array of cells comprises program instructions to perform a multivariate linear regression computation using the set of input vectors and the set of output vectors to determine the weight values of the given matrix stored in the array of cells.

14. The computer program product of claim 10, wherein the program instructions to determine the weight values of the given matrix stored in the array of cells further comprise:

program instructions to determine an inverse of the third matrix; and program instructions to multiply the inverse of the third matrix, the first matrix, and a transpose of the second matrix to thereby generate a fourth matrix;

wherein a transpose of the fourth matrix comprises the determined weight values of the given matrix stored in the array of cells.

15. The computer program product of claim 10, further comprising:

program instructions to compare the determined weight values with corresponding target weight values of the given matrix stored in the array of cells to determine differences between the determined weight values and the corresponding target weight values; and program instruction to quantify one of a non-linear response and write noise associated with hardware elements of the resistive processing unit, based on the determined differences between the determined weight values and the corresponding target weight values;

program instructions to perform a second weight extraction process to determine second weight values of the given matrix stored in the array of cells;

program instructions to compare the determined weight values of the given matrix stored in the array of cells with corresponding ones of the second determined weight values of the given matrix stored in the array of cells to determine differences between the determined weight values and the corresponding second determined weight values; and program instructions to quantify one of a non-linear response and write noise associated with the hardware elements of the resistive processing unit, based on the determined differences between the determined weight values and the corresponding second determined weight values.

16. The computer program product of claim 15, further comprising:

program instructions to store the array of weights in the array of cells of the resistive processing unit using programmed weight values which correspond to the target weight values;

program instructions to estimate a transfer function which represents a relationship between the programmed weight values and the corresponding determined weight values determined as a result of performing the weight extraction process;

program instruction to apply the target weight values to an inverse of the transfer function to thereby determine a new set of programmed weights;

program instructions to determine whether the determined weight values have converged to the target weight values within a predetermined accuracy threshold value; and program instructions to update the array of weights stored in the array of cells of the resistive processing unit using the new set of programmed weight, in response to determining that the determined weight values have not converged to the target weight values within the predetermined accuracy threshold value.

17. A method comprising:

storing a given matrix of weight values in an array of cells of a resistive processing unit; and performing a weight extraction process which comprises:

applying a set of input vectors to the resistive processing unit to perform analog matrix-vector multiplication operations on the given matrix;

obtaining a set of output vectors resulting from the analog matrix-vector multiplication operations; and determining weight values of the given matrix stored in the array of cells utilizing the set of input vectors and the set of output vectors, the determining comprising:

generating a first matrix comprising the set of input vectors;

generating a second matrix comprising the set of output vectors; and multiplying the first matrix by a transpose of the first matrix to thereby generate a third matrix.

18. The method of claim 17, wherein applying the set of input vectors to the resistive processing unit to perform the analog matrix-vector multiplication operations comprises applying a set of linearly independent input vectors to the resistive processing unit.

19. The method of claim 17, wherein determining the weight values of the given matrix stored in the array of cells, further comprises:
- determining an inverse of the third matrix; and
- multiplying the inverse of the third matrix, the first matrix, and a transpose of the second matrix to thereby generate a fourth matrix;
- wherein a transpose of the fourth matrix comprises the determined weight values of the given matrix stored in the array of cells.

20. The method of claim 17, further comprising:
- storing the array of weights in the array of cells of the resistive processing unit using programmed weight values which correspond to target weight values;
- estimating a transfer function which represents a relationship between the programmed weight values and the corresponding determined weight values determined as a result of performing the weight extraction process;
- applying the target weight values to an inverse of the transfer function to thereby determine a new set of programmed weights;
- determining whether the determined weight values have converged to the target weight values within a predetermined accuracy threshold value; and
- updating the array of weights stored in the array of cells of the resistive processing unit using the new set of programmed weight, in response to determining that the determined weight values have not converged to the target weight values within the predetermined accuracy threshold value.

* * * * *